(12) United States Patent
Ma et al.

(10) Patent No.: US 11,626,370 B2
(45) Date of Patent: Apr. 11, 2023

(54) INTERCONNECTION STRUCTURE OF A SEMICONDUCTOR CHIP AND SEMICONDUCTOR PACKAGE INCLUDING THE INTERCONNECTION STRUCTURE

(71) Applicant: Samsung Electronics Co., Ltd., Suwon-si (KR)

(72) Inventors: Keumhee Ma, Suwon-si (KR); Chulyong Jang, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 84 days.

(21) Appl. No.: 17/213,025

(22) Filed: Mar. 25, 2021

(65) Prior Publication Data

US 2022/0093521 A1 Mar. 24, 2022

(30) Foreign Application Priority Data

Sep. 23, 2020 (KR) ........................ 10-2020-0122984

(51) Int. Cl.
*H01L 23/48* (2006.01)
*H01L 23/538* (2006.01)
(Continued)

(52) U.S. Cl.
CPC .... *H01L 23/5386* (2013.01); *H01L 23/49816* (2013.01); *H01L 23/49838* (2013.01); *H01L 24/03* (2013.01); *H01L 24/05* (2013.01); *H01L 24/06* (2013.01); *H01L 24/08* (2013.01); *H01L 24/11* (2013.01); *H01L 24/13* (2013.01); *H01L 24/16* (2013.01); *H01L 2224/0362* (2013.01); *H01L 2224/03462* (2013.01); *H01L 2224/05582* (2013.01); *H01L 2224/0603* (2013.01); *H01L 2224/08146* (2013.01);
(Continued)

(58) Field of Classification Search
None
See application file for complete search history.

(56) References Cited

U.S. PATENT DOCUMENTS 6,281,581 B1 8/2001 Desai et al.
7,943,513 B2 5/2011 Lin
(Continued)

FOREIGN PATENT DOCUMENTS

JP 2014017454 A 1/2014
KR 20100020718 A 2/2010
(Continued)

*Primary Examiner* — Hung K Vu
(74) *Attorney, Agent, or Firm* — Muir Patent Law, PLLC

(57) ABSTRACT

An interconnection structure of a semiconductor chip may include an interconnection via, a lower pad, a conductive bump, and an upper pad. The interconnection via may be arranged in the semiconductor chip. The lower pad may be arranged on a lower end of the interconnection via exposed through a lower surface of the semiconductor chip. The conductive bump may be arranged on the lower pad. The upper pad may be arranged on an upper end of the interconnection via exposed through an upper surface of the semiconductor chip. The upper pad may have a width wider than a width of the interconnection via and narrower than a width of the lower pad. Thus, an electrical short between the conductive bumps may not be generated in the interconnection structure having a thin thickness.

20 Claims, 19 Drawing Sheets

(51) Int. Cl.
  *H01L 23/00* (2006.01)
  *H01L 23/498* (2006.01)
(52) U.S. Cl.
  CPC .......... *H01L 2224/11462* (2013.01); *H01L 2224/11622* (2013.01); *H01L 2224/13026* (2013.01); *H01L 2224/16148* (2013.01); *H01L 2224/16155* (2013.01); *H01L 2924/1431* (2013.01); *H01L 2924/1437* (2013.01)

(56) References Cited

U.S. PATENT DOCUMENTS

| | | | |
|---|---|---|---|
| 8,264,850 B2 | 9/2012 | So et al. | |
| 8,435,835 B2 * | 5/2013 | Pagaila | H01L 25/50 257/E23.079 |
| 8,697,490 B2 | 4/2014 | Pendse | |
| 8,803,334 B2 * | 8/2014 | Choi | H01L 25/03 257/737 |
| 9,196,581 B2 | 11/2015 | Haba et al. | |
| 9,768,142 B2 | 9/2017 | Lin et al. | |
| 9,929,109 B2 | 3/2018 | Wu et al. | |
| 10,115,693 B2 | 10/2018 | Hatasawa | |
| 10,319,653 B2 | 6/2019 | Takemura et al. | |
| 10,475,746 B2 | 11/2019 | Hatasawa | |
| 10,580,726 B2 | 3/2020 | Chun et al. | |
| 10,600,838 B2 | 3/2020 | Wakiyama et al. | |
| 10,734,322 B2 | 8/2020 | Hatasawa | |
| 2010/0038778 A1 | 2/2010 | Lee et al. | |
| 2014/0131886 A1 * | 5/2014 | Paek | H01L 25/0657 438/109 |
| 2014/0284785 A1 * | 9/2014 | Sung | H01L 23/3135 438/109 |
| 2016/0351472 A1 | 12/2016 | Park et al. | |
| 2017/0309593 A1 | 10/2017 | Kang et al. | |
| 2019/0326344 A1 | 10/2019 | Wakiyama et al. | |

FOREIGN PATENT DOCUMENTS

| | | |
|---|---|---|
| KR | 20150129799 A | 11/2015 |
| KR | 20160143640 A | 12/2016 |
| KR | 20170094026 A | 8/2017 |

* cited by examiner

INTERCONNECTION STRUCTURE OF A SEMICONDUCTOR CHIP AND SEMICONDUCTOR PACKAGE INCLUDING THE INTERCONNECTION STRUCTURE

CROSS-RELATED APPLICATION

This application claims priority under 35 U.S.C. § 119 to Korean Patent Application No. 10-2020-0122984, filed on Sep. 23, 2020, in the Korean Intellectual Property Office (KIPO), the contents of which are herein incorporated by reference in their entirety.

BACKGROUND

1. Field

Example embodiments relate to an interconnection structure of a semiconductor chip and a method of manufacturing the interconnection structure, and a semiconductor package including the interconnection structure and a method of manufacturing the semiconductor package. More particularly, example embodiments relate to an interconnection structure configured to electrically connect stacked semiconductor chips with each other and a method of manufacturing the interconnection structure, and a semiconductor package including the interconnection structure and a method of manufacturing the semiconductor package.

2. Description of the Related Art

A semiconductor package may include a plurality of stacked semiconductor chips. The semiconductor chips may be electrically connected with each other via an interconnection structure. The interconnection structure may include conductive bumps, pads, interconnection vias such as a through silicon via (TSV), etc.

According to related arts, as numbers of the stacked semiconductor chips may have been increased, a pitch between the conductive bumps may be decreased and a width of the interconnection via may also be reduced. Thus, it may be required to reduce a thickness of the interconnection structure while preventing an electrical short between the conductive bumps.

SUMMARY

Example embodiments provide an interconnection structure of a semiconductor chip that may be capable of preventing an electrical short between conductive bumps with a thin thickness of the interconnection structure.

Example embodiments also provide a method of manufacturing the above-mentioned interconnection structure.

Example embodiments also provide a semiconductor package including stacked semiconductor chips with the above-mentioned interconnection structure.

Example embodiments also provide a method of manufacturing the above-mentioned semiconductor package.

According to example embodiments, there may be provided an interconnection structure of a semiconductor chip. The interconnection structure may include an interconnection via, a lower pad, a conductive bump and an upper pad. The interconnection via may be arranged in the semiconductor chip. The lower pad may be arranged on a lower end of the interconnection via exposed through a lower surface of the semiconductor chip. The conductive bump may be arranged on the lower pad. The upper pad may include a body pad and an interconnection pad. The body pad may be arranged on an upper end of the interconnection via exposed through an upper surface of the semiconductor chip. The interconnection pad may be arranged on the body pad. The body pad may have a width substantially the same as a width of the lower pad. The interconnection pad may have a width wider than a width of the interconnection via and narrower than the width of the lower pad.

According to example embodiments, there may be provided an interconnection structure of a semiconductor chip. The interconnection structure may include an interconnection via, a lower pad, a conductive bump, and an upper pad. The interconnection via may be arranged in the semiconductor chip. The lower pad may be arranged on a lower end of the interconnection via exposed through a lower surface of the semiconductor chip. The conductive bump may be arranged on the lower pad. The upper pad may be arranged on an upper end of the interconnection via exposed through an upper surface of the semiconductor chip. The upper pad may have a width wider than a width of the interconnection via and narrower than a width of the lower pad.

According to example embodiments, there may be provided a semiconductor package. The semiconductor package may include a package substrate, a first semiconductor chip, a first interconnection via, a first lower pad, a first conductive bump, a first upper pad, a second semiconductor chip, an insulation film, a second interconnection via, a second lower pad, a second conductive bump, and a second upper pad. The first semiconductor chip may be arranged on an upper surface of the package substrate. The first interconnection via may be arranged in the first semiconductor chip. The first lower pad may be arranged on a lower end of the first interconnection via exposed through a lower surface of the first semiconductor chip. The first conductive bump may be arranged on the first lower pad. The first conductive bump may be electrically connected with the package substrate. The first upper pad may include a first body pad and a first interconnection pad. The first body pad may be arranged on an upper end of the first interconnection via exposed through an upper surface of the first semiconductor chip. The first interconnection pad may be arranged on the first body pad. The second semiconductor chip may be arranged over the first semiconductor chip. The insulation film may be interposed between the first semiconductor chip and the second semiconductor chip. The second interconnection via may be arranged in the second semiconductor chip. The second lower pad may be arranged on a lower end of the second interconnection via exposed through a lower surface of the second semiconductor chip. The second conductive bump may be arranged on the second lower pad. The second conductive bump may be electrically connected with the first upper pad. The second upper pad may include a second body pad and a second interconnection pad. The second body pad may be arranged on an upper end of the second interconnection via exposed through an upper surface of the second semiconductor chip. The second interconnection pad may be arranged on the second body pad. The first body pad may have a width substantially the same as a width of the first lower pad. The first interconnection pad may have a width wider than a width of the first interconnection via and narrower than the width of the first lower pad. The second body pad may have a width substantially the same as a width of the second lower pad. The second interconnection pad may have a width wider than a width of the second interconnection via and narrower than the width of the second lower pad.

According to example embodiments, there may be provided a semiconductor package. The semiconductor package may include a package substrate, a first semiconductor chip, a first interconnection via, a first lower pad, a first conductive bump, a first upper pad, a second semiconductor chip, a second interconnection via, a second lower pad, a second conductive bump, and a second upper pad. The first semiconductor chip may be arranged on an upper surface of the package substrate. The first interconnection via may be arranged in the first semiconductor chip. The first lower pad may be arranged on a lower end of the first interconnection via exposed through a lower surface of the first semiconductor chip. The first conductive bump may be arranged on the first lower pad. The first conductive bump may be electrically connected with the package substrate. The first upper pad may be arranged on an upper end of the first interconnection via exposed through an upper surface of the first semiconductor chip. The first upper pad may have a width wider than a width of the first interconnection via and narrower than a width of the first lower pad. The second semiconductor chip may be arranged over the first semiconductor chip. The second interconnection via may be arranged in the second semiconductor chip. The second lower pad may be arranged on a lower end of the second interconnection via exposed through a lower surface of the second semiconductor chip. The second conductive bump may be arranged on the second lower pad. The second conductive bump may be electrically connected with the first upper pad. The second upper pad may be arranged on an upper end of the second interconnection via exposed through an upper surface of the second semiconductor chip. The first body pad may have a width substantially the same as a width of the first lower pad. The first interconnection pad may have a width wider than a width of the first interconnection via and narrower than the width of the first lower pad. The second upper pad may have a width wider than a width of the second interconnection via and narrower than a width of the second lower pad.

According to example embodiments, there may be provided a method of manufacturing an interconnection structure of a semiconductor chip. In the method of manufacturing the interconnection structure of the semiconductor chip, an interconnection via may be formed in the semiconductor chip. A lower pad may be formed on a lower end of the interconnection via exposed through a lower surface of the semiconductor chip. A conductive bump may be formed on the lower pad. An upper pad may be formed on an upper end of the interconnection via exposed through an upper surface of the semiconductor chip. The upper pad may have a width wider than a width of the interconnection via and narrower than a width of the lower pad.

According to example embodiments, there may be provided a method of manufacturing a semiconductor package. In the method of manufacturing the semiconductor package, a first semiconductor chip may be arranged on an upper surface of a package substrate to electrically connect the first semiconductor chip with the package substrate via a first conductive bump. The first semiconductor chip may include a first interconnection structure. The first interconnection structure may include a first interconnection via, a first lower pad, the first conductive bump and a first upper pad. The first interconnection via may be arranged in the first semiconductor chip. The first lower pad may be arranged on a lower end of the first interconnection via exposed through a lower surface of the first semiconductor chip. The first conductive bump may be arranged on the first lower pad. The first upper pad may be arranged on an upper end of the first interconnection via exposed through an upper surface of the first semiconductor chip. The first upper pad may have a width wider than a width of the first interconnection via and narrower than a width of the first lower pad. A second semiconductor chip may be arranged on an upper surface of the first semiconductor chip. The second semiconductor chip may include a second interconnection structure. The second interconnection structure may include a second interconnection via, a second lower pad, a second conductive bump and a second upper pad. The second interconnection via may be arranged in the second semiconductor chip. The second lower pad may be arranged on a lower end of the second interconnection via exposed through a lower surface of the second semiconductor chip. The second conductive bump may be arranged on the second lower pad. The second upper pad may be arranged on an upper end of the second interconnection via exposed through an upper surface of the second semiconductor chip. The second upper pad may have a width wider than a width of the second interconnection via and narrower than a width of the second lower pad. The second conductive bump may be thermally compressed to the first upper pad to electrically connect the first semiconductor chip with the second semiconductor chip.

According to example embodiments, there may be provided a semiconductor package. The semiconductor package may include a package substrate, an interposer, at least one first semiconductor chip and at least two semiconductor chips. The interposer may be arranged on an upper surface of the package substrate. The first semiconductor chip may be arranged on an upper surface of the interposer. The second semiconductor chips may be stacked on the upper surface of the interposer. Each of the second semiconductor chips may include an interconnection via, a lower pad, a conductive bump and an upper pad. The interconnection via may be arranged in the second semiconductor chip. The lower pad may be arranged on a lower end of the interconnection via exposed through a lower surface of the second semiconductor chip. The conductive bump may be arranged on the lower pad. The upper pad may be arranged on an upper end of the interconnection via exposed through an upper surface of the second semiconductor chip. The upper pad may have a width wider than a width of the interconnection via and narrower than a width of the lower pad.

According to example embodiments, there may be provided a semiconductor package. The semiconductor package may include a package substrate, a logic chip, at least one first semiconductor chip, and at least two semiconductor chips. The logic chip may be arranged on an upper surface of the package substrate. The first semiconductor chip may be arranged on an upper surface of the interposer. The second semiconductor chips may be stacked on the upper surface of the interposer. Each of the second semiconductor chips may include an interconnection via, a lower pad, a conductive bump, and an upper pad. The interconnection via may be arranged in the second semiconductor chip. The lower pad may be arranged on a lower end of the interconnection via exposed through a lower surface of the second semiconductor chip. The conductive bump may be arranged on the lower pad. The upper pad may be arranged on an upper end of the interconnection via exposed through an upper surface of the second semiconductor chip. The upper pad may have a width wider than a width of the interconnection via and narrower than a width of the lower pad.

According to example embodiments, the width of the upper pad may be wider than the width of the interconnection via and narrower than the width of the lower pad to improve electrical connection reliability between the upper pad and the conductive bump. Thus, an electrical short between the conductive bumps may not be generated in the interconnection structure having a thin thickness.

BRIEF DESCRIPTION OF THE DRAWINGS

Example embodiments will be more clearly understood from the following detailed description taken in conjunction with the accompanying drawings.

FIG. 1 is a cross-sectional view illustrating an interconnection structure of a semiconductor chip in accordance with example embodiments;

FIGS. 2 to 11 are cross-sectional views illustrating a method of manufacturing the interconnection structure in FIG. 1;

FIG. 12 is a cross-sectional view illustrating an interconnection structure of a semiconductor chip in accordance with example embodiments:

FIGS. 13 and 14 are cross-sectional views illustrating a method of manufacturing the interconnection structure in FIG. 12;

FIG. 15 is a cross-sectional view illustrating an interconnection structure of a semiconductor chip in accordance with example embodiments;

FIG. 16 is a cross-sectional view illustrating an interconnection structure of a semiconductor chip in accordance with example embodiments;

FIG. 17 is a cross-sectional view illustrating a semiconductor package including the interconnection structure in FIG. 1;

FIGS. 18 to 21 are cross-sectional views illustrating a method of manufacturing the semiconductor package in FIG. 17;

FIG. 22 is a cross-sectional view illustrating a semiconductor package including the interconnection structure in FIG. 12;

FIG. 23 is a cross-sectional view illustrating a semiconductor package including the interconnection structure in FIG. 15;

FIG. 24 is a cross-sectional view illustrating a semiconductor package including the interconnection structure in FIG. 16:

FIG. 25 is a cross-sectional view illustrating a semiconductor package including the interconnection structure in FIG. 1; and FIG. 26 is a cross-sectional view illustrating a semiconductor package including the interconnection structure in FIG. 1.

DETAILED DESCRIPTION OF THE EMBODIMENTS

Figure 1:
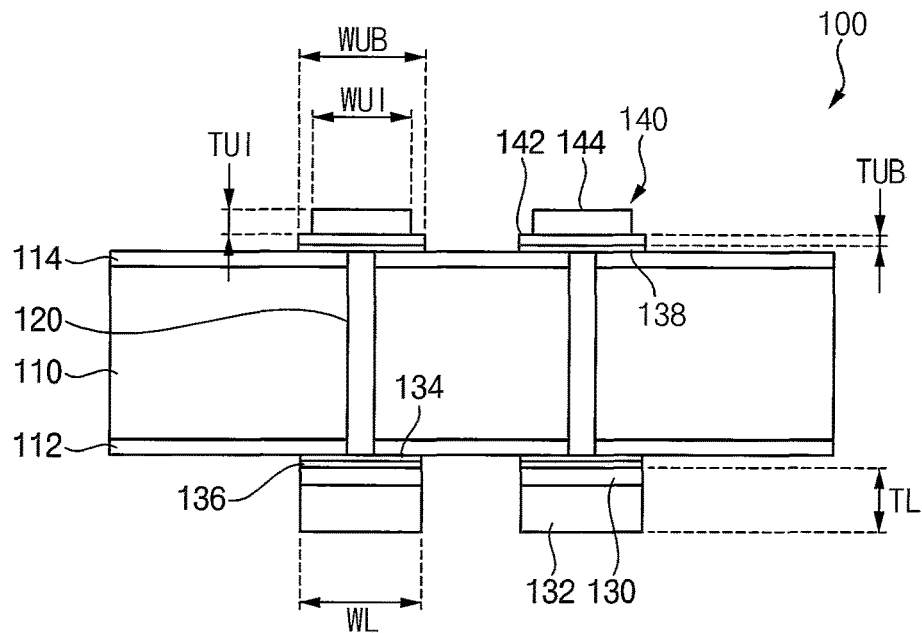
FIGS. 1 to 26 represent non-limiting, example embodiments as described herein.

Hereinafter, example embodiments will be explained in detail with reference to the accompanying drawings. In the drawings, like numerals refer to like elements throughout.

FIG. 1 is a cross-sectional view illustrating an interconnection structure of a semiconductor chip in accordance with example embodiments.

Referring to FIG. 1, an interconnection structure 100 of a semiconductor chip in accordance with example embodiments may include an interconnection via 120, a lower pad 130, a conductive bump 132, and an upper pad 140.

A semiconductor chip 110 may have an upper surface and a lower surface. An upper insulation layer 114 may be formed on the upper surface of the semiconductor chip 110.

A lower insulation layer 112 may be formed on the lower surface of the semiconductor chip 110.

The interconnection via 120 may be arranged in the semiconductor chip 110. The interconnection via 120 may vertically penetrate through the semiconductor chip 110. Thus, the interconnection via 120 may include an upper end exposed through the upper surface of the semiconductor chip 110, and a lower end exposed through the lower surface of the semiconductor chip 110. The upper end of the interconnection via 120 may be exposed through an opening formed through the upper insulation layer 114. The lower end of the interconnection via 120 may be exposed through an opening formed through the lower insulation layer 112. For example, the upper end of the interconnection via 120 may be coplanar with an upper surface of the upper insulation layer 114, and the lower end of the interconnection via 120 may be coplanar with a lower surface of the lower insulation layer 112. The interconnection via 120 may include a through silicon via (TSV). The interconnection via 120 may include a plurality of interconnection vias 120.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In example embodiments, the interconnection via 120 may have a width of about 4 μm to about 5 μm. When the interconnection via 120 has a circular cross-sectional shape, the width of the interconnection via 120 may be a diameter of the interconnection via 120.

The lower pad 130 may be arranged on the lower surface of the semiconductor chip 110. The lower pad 130 may be positioned on the lower end of the interconnection via 120 exposed through the lower surface of the semiconductor chip 110. For example, the lower pad 130 may contact the lower end of the interconnection via 120. Thus, the lower pad 130 may be electrically connected to the lower end of the interconnection via 120. The lower pad 130 may include nickel, not restricted within a specific material.

The lower pad 130 may be formed by an electroplating process on a seed layer 136. Thus, the seed layer 136 may be formed on the lower end of the interconnection via 120. The seed layer 136 may include copper, not restricted within a specific material. The lower pad 130 may include a plurality of lower pads 130.

In example embodiments, the lower pad 130 may have a width WL and a thickness TL. The width WL of the lower pad 130 may be about 15 μm to about 20 μm. However, the width WL of the lower pad 130 may not be restricted within the above-mentioned range. When the lower pad 130 may have a circular cross-sectional shape, the width WL of the lower pad 130 may be a diameter of the lower pad 130. The thickness TL of the lower pad 130 may be about 10 μm to about 17 μm. However, the thickness TL of the lower pad 130 may not be restricted within the above-mentioned range.

As used herein, thickness may refer to the thickness or height measured in a direction perpendicular to a top surface of the substrate.

The conductive bump 132 may be arranged on a lower surface of the lower pad 130. An upper surface of the conductive bump 132 may contact the lower surface of the lower pad 130. The conductive bump 132 may include solder. In example embodiments, the conductive bump 132 may not be formed by a reflow process. A process for forming the conductive bump 132 may be illustrated later. The conductive bump 132 may include a plurality of conductive bumps 132.

In order to prevent the solder in the conductive bump 132 into infiltrating into the semiconductor chip 110, a barrier layer 134 may be interposed between the seed layer 136 and the lower surface of the semiconductor chip 110, particularly, the seed layer 136 and the lower insulation layer 112. The barrier layer 134 may include titanium, not restricted within a specific material.

The upper pad 140 may be arranged on the upper surface of the semiconductor chip 110. The upper pad 140 may be positioned on the upper end of the interconnection via 120 exposed through the upper surface of the semiconductor chip 110. For example, the upper pad 140 may contact the upper end of the interconnection via 120. Thus, the upper pad 140 may be electrically connected to the upper end of the interconnection via 120. As a result, the upper pad 140 and the lower pad 130 may be electrically connected with each other via the interconnection via 120. The upper pad 140 may have a thickness thinner than the thickness TL of the lower pad 130. The upper pad 140 may include a plurality of upper pads 140. The upper pad 140 may be formed by an electroplating process on a seed layer 138. Thus, the seed layer 138 may be formed on the upper end of the interconnection via 120. The seed layer 138 may include copper, not restricted within a specific material.

In example embodiments, the upper pad 140 may include a body pad 142 and an interconnection pad 144.

The body pad 142 may be arranged on the upper end of the interconnection via 120. The body pad 142 may have a width WUB and a thickness TUB. The width WUB of the body pad 142 may be about 15 μm to about 20 μm. For example, the width WUB of the body pad 142 may be substantially the same as the width WL of the lower pad 130. However, the width WUB of the body pad 142 may not be restricted within the above-mentioned range. For example, the width WUB of the body pad 142 may be wider or narrower than the width WL of the lower pad 130. When the body pad 142 has a circular cross-sectional shape, the width WUB of the body pad 142 may be a diameter of the body pad 142. Further, the thickness TUB of the body pad 142 may be about 2 μm to about 3 μm. However, the thickness TUB of the body pad 142 may not be restricted within the above-mentioned range. The body pad 142 may include nickel, not restricted within a specific material.

The interconnection pad 144 may be arranged on an upper surface of the body pad 142. A lower surface of the interconnection pad 144 may contact the upper surface of the body pad 142. Particularly, the interconnection pad 144 may be positioned on a central portion of the upper surface of the body pad 142. The interconnection pad 144 may have a width WUI and a thickness TUI. The width WUI of the interconnection pad 144 may be about 5 μm to about 81 μm. For example, the width WUI of the interconnection pad 144 may be narrower than the width WUB of the body pad 142. As mentioned above, when the width WB of the body pad 142 is substantially the same as the width WL of the lower pad 130, the width WUI of the interconnection pad 144 may be narrower than the width WL of the lower pad 130. In contrast, the width WUI of the interconnection pad 144 may be wider than the width of the interconnection via 120. However, the width WUI of the interconnection pad 144 may not be restricted within the above-mentioned range. When the interconnection pad 144 has a circular cross-sectional shape, the width WUI of the interconnection pad 144 may be a diameter of the interconnection pad 144.

Further, the thickness TUI of the interconnection pad 144 may be thicker than the thickness TUB of the body pad 142. In example embodiments, the thickness TUI of the interconnection pad 144 may be about 4 μm to about 5 μm. However, the thickness TUI of the interconnection pad 144 may not be restricted within the above-mentioned range.

In example embodiments, the interconnection pad 144 may penetrate an insulation film interposed between stacked semiconductor chips. The interconnection pad 144 may electrically make contact with a conductive bump of an upper semiconductor chip. Because the interconnection pad 144 having the width WUI narrower than the width WUB of the body pad 142 may be protruded from the body pad 142, the interconnection pad 144 may readily penetrate the insulation film to make contact with the conductive bump of the upper semiconductor chip. However, when the width WUI of the interconnection pad 144 is no more than the width of the interconnection via 120, the interconnection pad 144 may not be easily aligned with the interconnection via 120. Thus, the width WUI of the interconnection pad 144 may be narrower than the width WUB of the body pad 142 and wider than the width of the interconnection via 120.

Further, the interconnection pad 144 may include a material having wettability with respect to the conductive bump 132. For example, the interconnection pad 144 may include gold, not restricted within a specific material.

FIGS. 2 to 11 are cross-sectional views illustrating a method of manufacturing the interconnection structure in FIG. 1.

Figure 2:
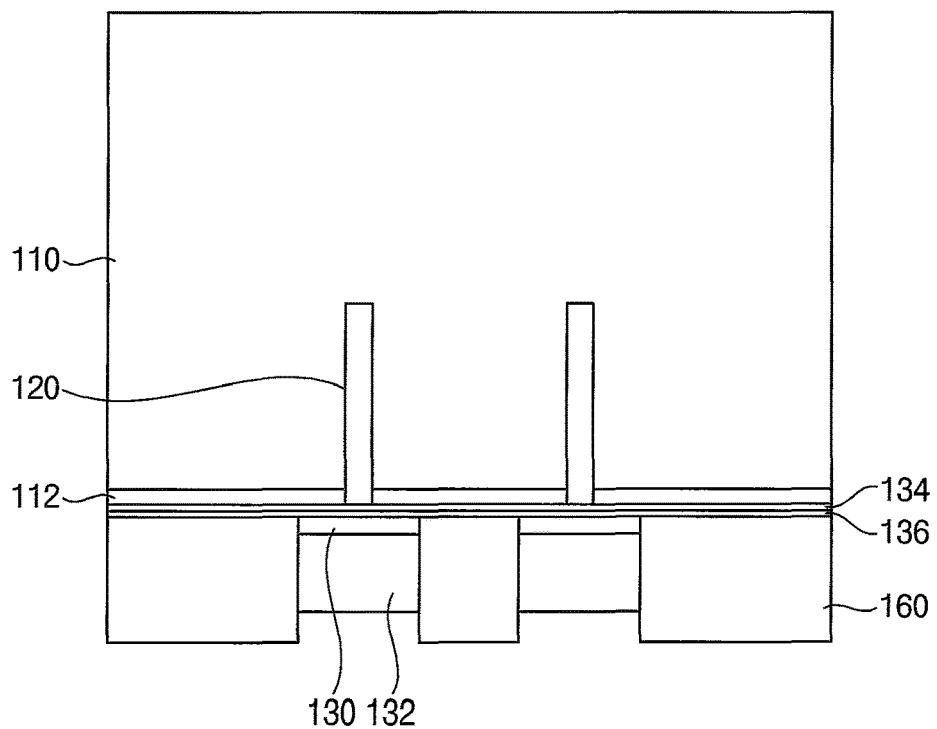

Referring to FIG. 2, the lower ends of the interconnection vias 120 may be exposed through the lower surface of the semiconductor chip 110. In contrast, the upper ends of the interconnection vias 120 may not be exposed through the upper surface of the semiconductor chip 110.

The barrier layer 134 and the seed layer 136 may be sequentially formed on the lower surface of the semiconductor chip 110. A photoresist pattern 160 may be formed on an upper surface of the seed layer 136. The photoresist pattern 160 may include a plurality of openings configured to expose a portion of the seed layer 136 over the upper end of the interconnection via 120.

An electroplating process may be performed on the portion of the seed layer 136 exposed through the openings of the photoresist pattern 160 to form the lower pads 130 on a lower surface of the seed layer 136. An electroplating process may be performed on the lower pads 130 to form the conductive bumps 132 on the lower surfaces of the lower pads 130. For example, the method of manufacturing the interconnection structure 100 in accordance with example embodiments may not include a reflow process for forming the conductive bump 132.

Figure 3:
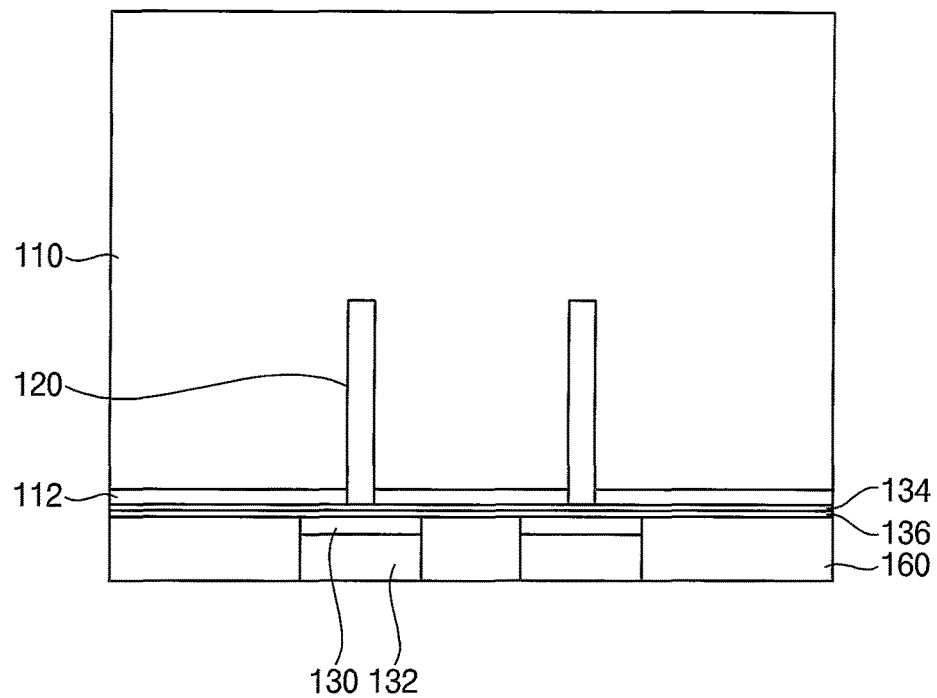

Referring to FIG. 3, the photoresist pattern 160 and the conductive bumps 132 may be partially removed to provide the photoresist pattern 160 and the conductive bumps 132 with upper surfaces substantially coplanar with each other. Thus, the conductive bumps 132 may have substantially the same thickness. The photoresist pattern 160 and the conductive bumps 132 may be removed by a mechanical process using a grinder, a blade, etc.

When the conductive bumps 132 have substantially the same thickness, that is, when the upper surfaces of the conductive bumps 132 are positioned on a same horizontal plane, the process for removing the photoresist pattern 160 and the conductive bumps 132 may be omitted.

Figure 4:
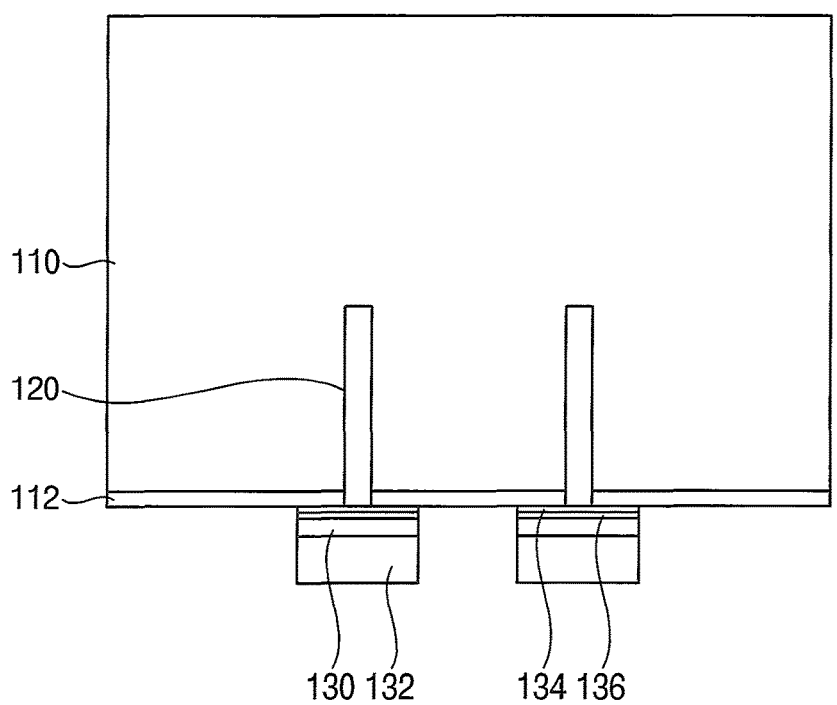

Referring to FIG. 4, the photoresist pattern 160 may then be removed. The photoresist pattern 160 may be removed by a stripping process and/or an ashing process. The barrier layer 134 and the seed layer 136 between the conductive bumps 132 may be removed by an etching process.

Figure 5:
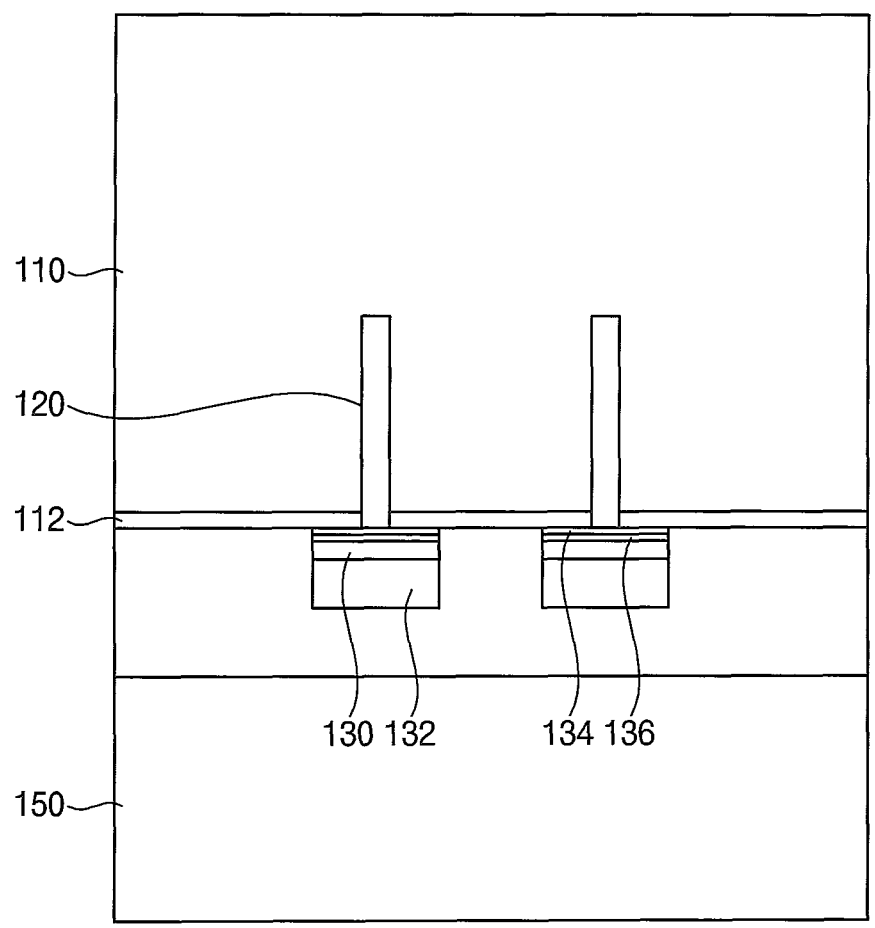

Referring to FIG. 5, a carrier substrate 150 may be attached to the lower surface of the semiconductor chip 110. Thus, the semiconductor chip 110 may be supported by the carrier substrate 150.

Figure 6:
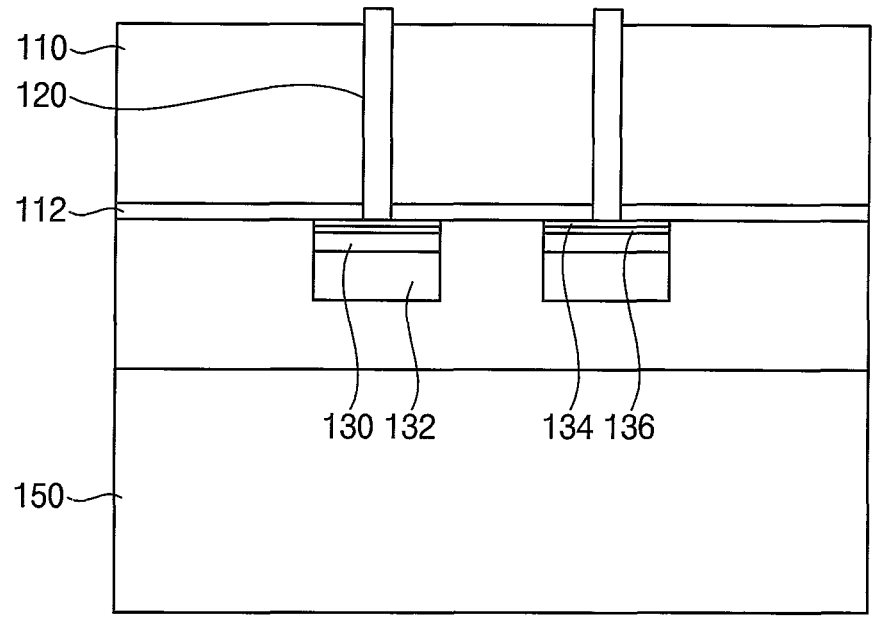

Referring to FIG. 6, the upper surface of the semiconductor chip 110 may be partially removed to expose the upper ends of the interconnection vias 120 through the upper surface of the semiconductor chip 110.

Figure 7:
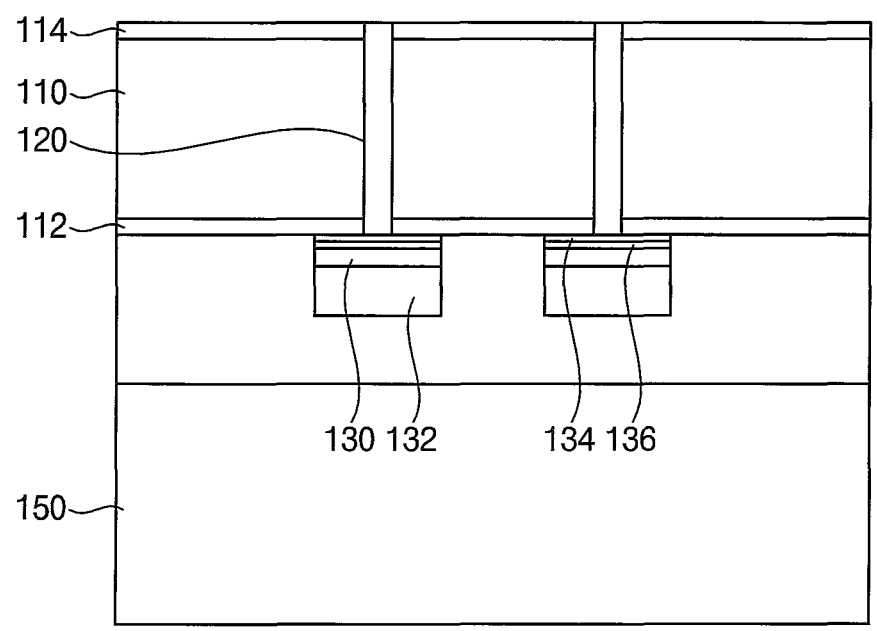

Referring to FIG. 7, the upper insulation layer 114 may be formed on the upper surface of the semiconductor chip 110. The upper insulation layer 114 may include the openings configured to expose the upper ends of the interconnection vias 120.

Figure 8:
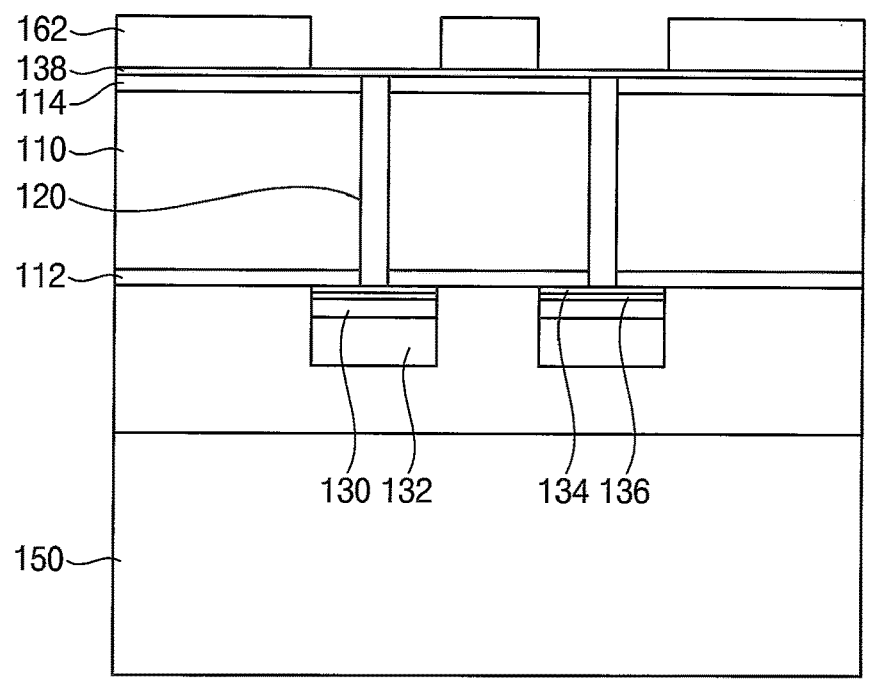

Referring to FIG. 8, the seed layer 138 may be formed on the upper surface of the upper insulation layer 114. A photoresist pattern 162 may be formed on an upper surface of the seed layer 138. The photoresist pattern 162 may include openings configured to expose a portion of the seed layer 138 over the upper ends of the interconnection vias 120.

Figure 9:
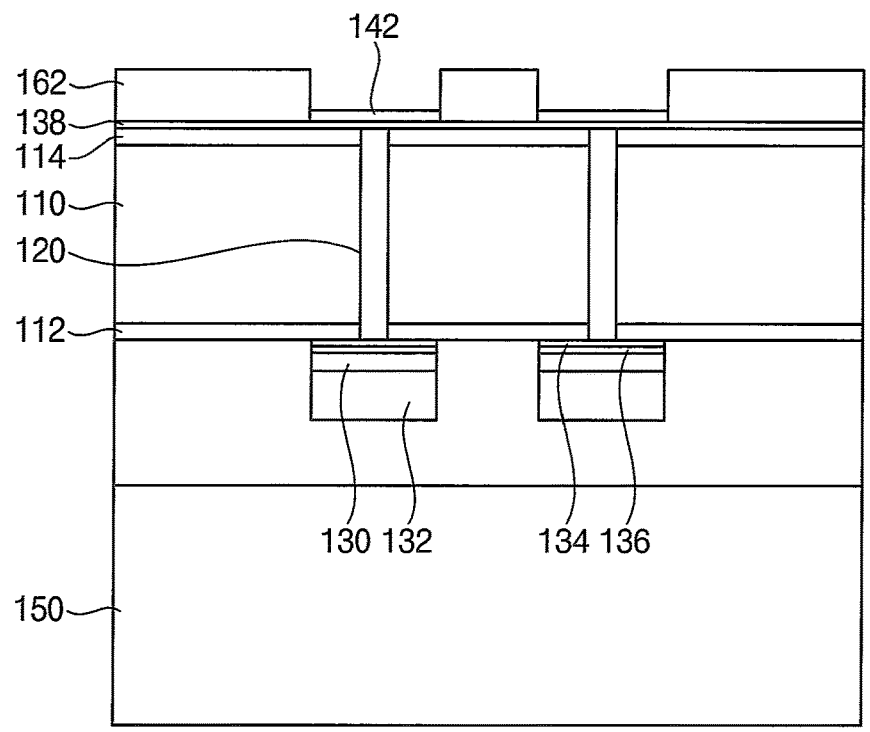

Referring to FIG. 9, an electroplating process may be performed on the exposed portion of the seed layer 138 to form the body pad 142 on the upper surface of the seed layer 138. The width WUB of the body pad 142 may be substantially the same as the width WL of the lower pad 130. However, the width WUB of the body pad 142 may be wider or narrower than the width WL of the lower pad 130. After forming the body pad 142, the photoresist pattern 162 may then be removed.

Figure 10:
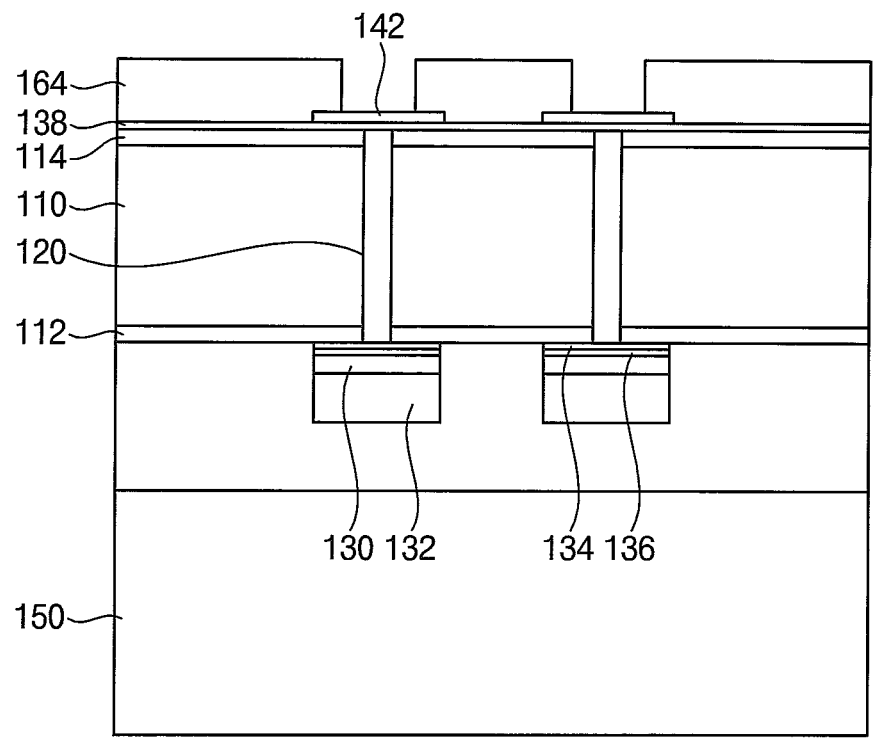

Referring to FIG. 10, a photoresist pattern 164 may be formed on upper surfaces of the seed layer 138 and the body pad 142. The photoresist pattern 164 may include an opening configured to expose the central portion of the upper surface of the body pad 142. The opening of the photoresist pattern 164 may define a shape of the interconnection pad 144.

Figure 11:
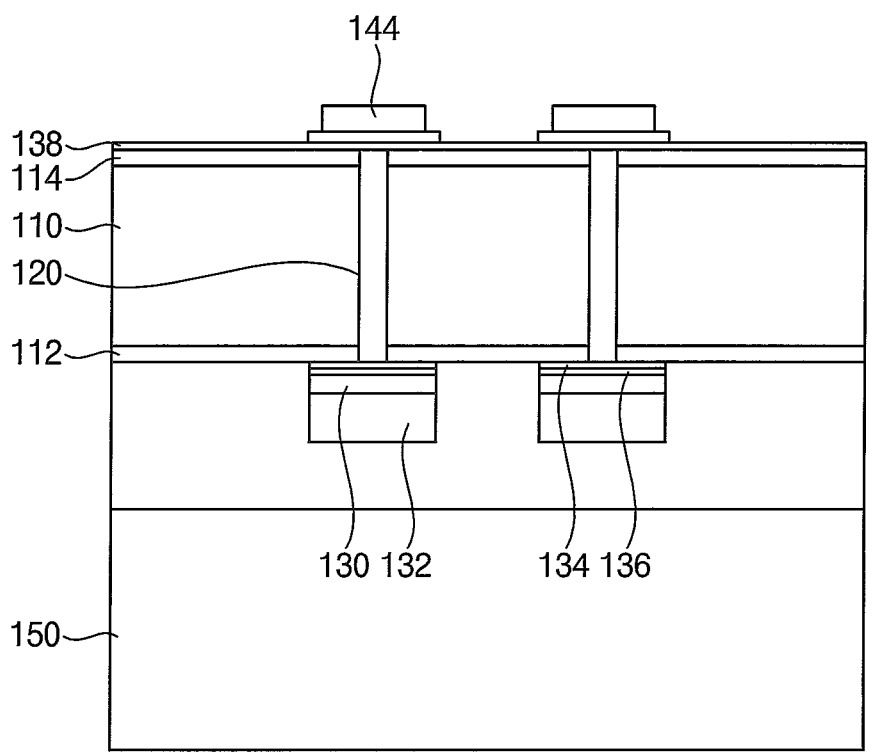

Referring to FIG. 11, an electroplating process may be performed on the exposed central portion of the upper surface of the body pad 142 to form the interconnection pad 144 on the central portion of the upper surface of the body pad 142. As mentioned above, the width WUI of the interconnection pad 144 may be narrower than the width WUB of the body pad 142 and wider than the width of the interconnection via 120. After forming the interconnection pad 144, the photoresist pattern 164 and the seed layer 138 may then be removed.

The carrier substrate 150 may be detached from the semiconductor chip 110 to complete the interconnection structure 100 of the semiconductor chip 110 in FIG. 1.

Figure 12:
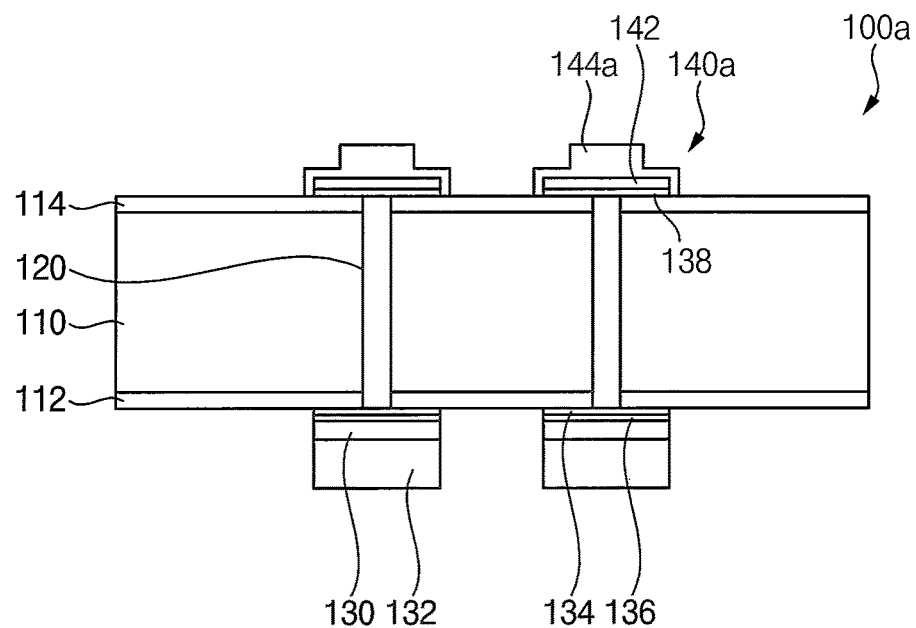

FIG. 12 is a cross-sectional view illustrating an interconnection structure of a semiconductor chip in accordance with example embodiments.

An interconnection structure 100a of this example embodiment may include elements substantially the same as those of the interconnection structure 100 in FIG. 1 except for an interconnection pad of an upper pad. Thus, the same reference numerals may refer to the same elements and any further illustrations with respect to the same elements may be omitted herein for brevity.

Referring to FIG. 12, an interconnection pad 144a of an upper pad 140a may be arranged on an upper surface and side surfaces of the body pad 142. Particularly, the interconnection pad 144a may be configured to surround the upper surface and the side surfaces of the body pad 142. For example, the interconnection pad 144a of this example embodiment may include a portion extended from a lower surface of the interconnection pad 144 in FIG. 1 along the upper surface and the side surfaces of the body pad 142. The interconnection pad 144a may contact the upper and side surfaces of the body pad 142 and an upper surface of the upper insulation layer 114.

Figure 13:
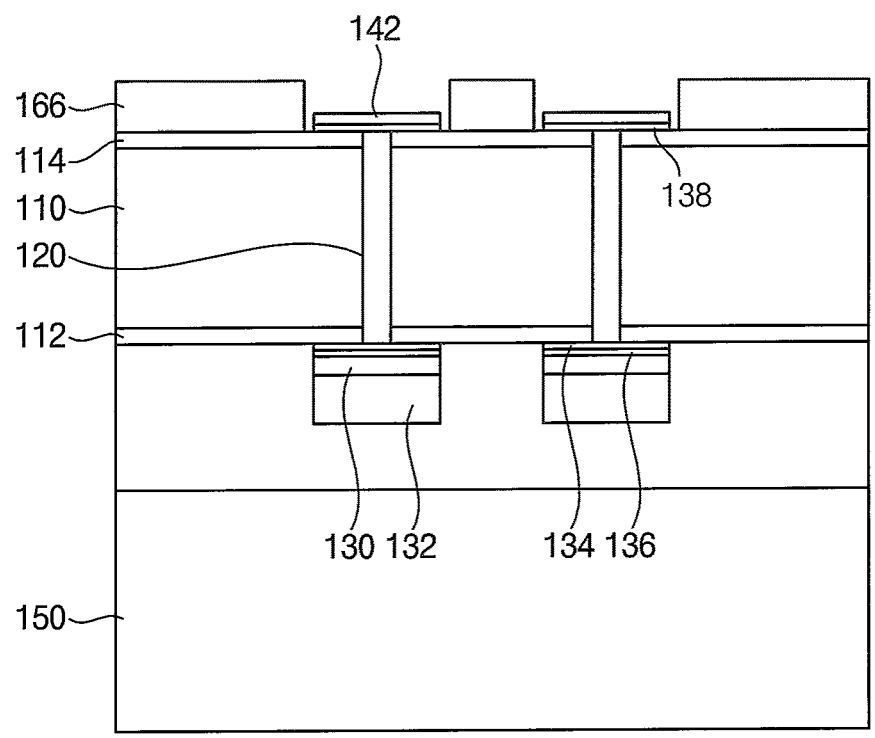
Figure 14:
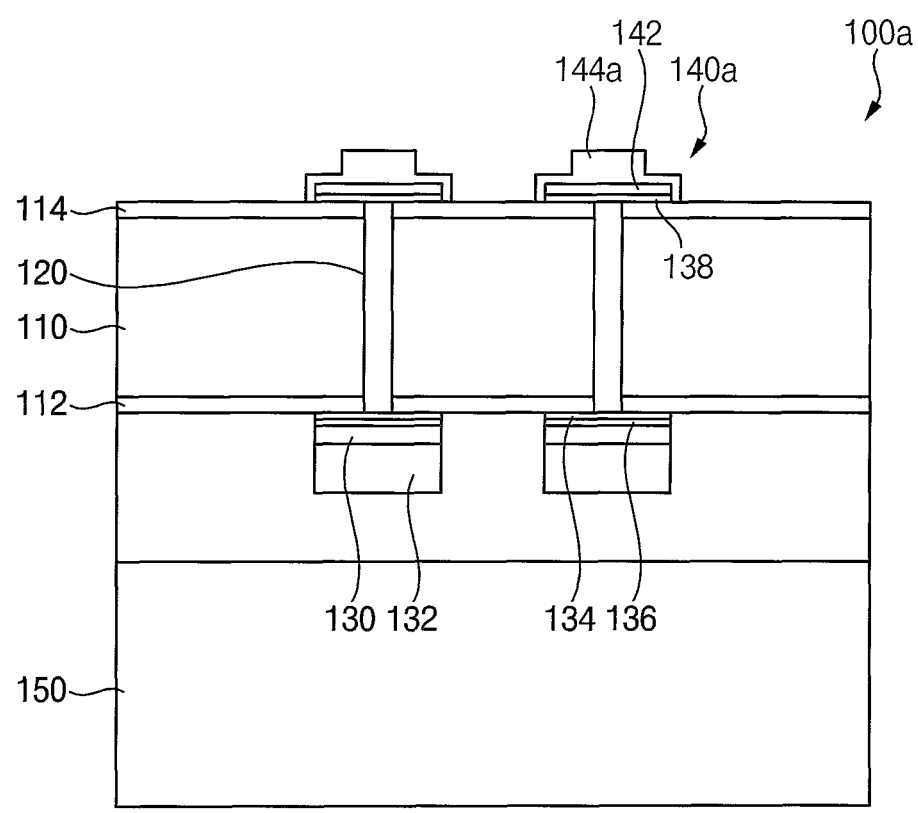

FIGS. 13 and 14 are cross-sectional views illustrating a method of manufacturing the interconnection structure in FIG. 12.

The method of manufacturing the interconnection structure 100a in accordance with this example embodiment may include processes substantially the same as the processes illustrated with reference to FIGS. 2 to 9.

Referring to FIG. 13, a photoresist pattern 166 may be formed on the upper surfaces of the seed layer 138 and the body pad 142. The photoresist pattern 166 may include an opening configured to expose the upper surface and the side surfaces of the body pad 142.

Referring to FIG. 14, an electroless plating process may be performed on the exposed upper surface and the side surfaces of the body pad 142 to form the interconnection pad 144a on the upper surface and the side surfaces of the body pad 142. After forming the interconnection pad 144a, the photoresist pattern 166 may then be removed.

The carrier substrate may be detached from the semiconductor chip 110 to complete the interconnection structure 100a of the semiconductor chip in FIG. 12.

Figure 15:
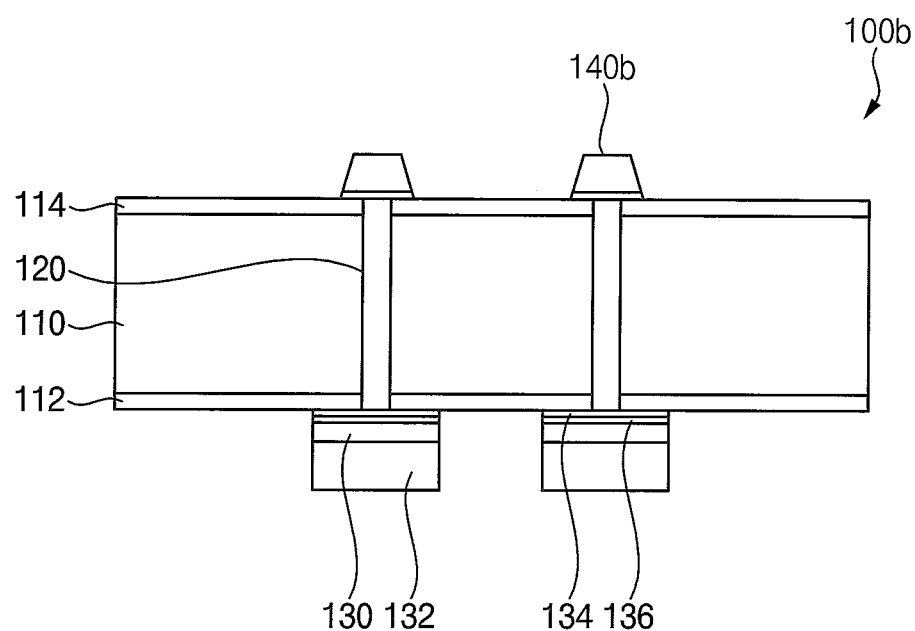

FIG. 15 is a cross-sectional view illustrating an interconnection structure of a semiconductor chip in accordance with example embodiments.

An interconnection structure 100b of this example embodiment may include elements substantially the same as those of the interconnection structure 100 in FIG. 1 except for an upper pad. Thus, the same reference numerals may refer to the same elements and any further illustrations with respect to the same elements may be omitted herein for brevity.

Referring to FIG. 15, an upper pad 140b may have a slant side surface. For example, the upper pad 140b may have a isosceles trapezoid shape, when viewed in cross section. Particularly, the upper pad 140b may include a lower surface having a lower width, an upper surface having an upper width and the slant side surface connected between the upper surface and the lower surface. Further, the slant side surface may have gradually decreased widths from the lower surface to the upper surface in the upper pad 140b. Thus, the lower width may be wider than the upper width. For example, the lower surface of the upper pad 140b may have an area larger than an area of the upper surface of the upper pad 140b.

A method of manufacturing the interconnection structure 100b in accordance with this example embodiment may include the processes substantially the same as the processes illustrated with reference to FIGS. 2 to 9 except for using a negative photoresist pattern in place of the photoresist pattern used in FIG. 8. Thus, the method of manufacturing the interconnection structure 100b may be omitted herein for brevity.

Figure 16:
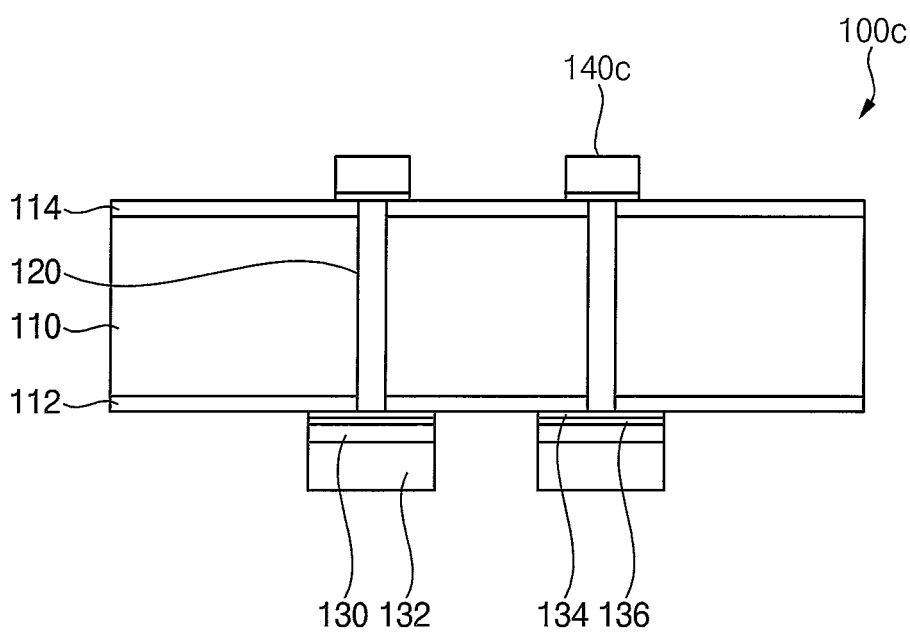

FIG. 16 is a cross-sectional view illustrating an interconnection structure of a semiconductor chip in accordance with example embodiments.

An interconnection structure 100c of this example embodiment may include elements substantially the same as those of the interconnection structure 100 in FIG. 1 except for an upper pad. Thus, the same reference numerals may refer to the same elements and any further illustrations with respect to the same elements may be omitted herein for brevity.

Referring to FIG. 16, an upper pad 140c may have a uniform width. Particularly, the upper pad 140c may include a lower surface, an upper surface, and a side surface connected between the lower surface and the upper surface. The lower surface and the upper surface may have substantially the same width. Thus, the side surface may be a vertical shape. The width of the lower surface and the upper surface in the upper pad 140c may be substantially the same as that the width of the interconnection pad 144 in FIG. 1. Thus, any illustrations with respect to the width of the lower surface and the upper surface in the upper pad 140c may be omitted herein for brevity.

A method of manufacturing the interconnection structure 100c in accordance with this example embodiment may include the processes substantially the same as the processes illustrated with reference to FIGS. 2 to 9. Thus, the method of manufacturing the interconnection structure 100c may be omitted herein for brevity.

Figure 17:
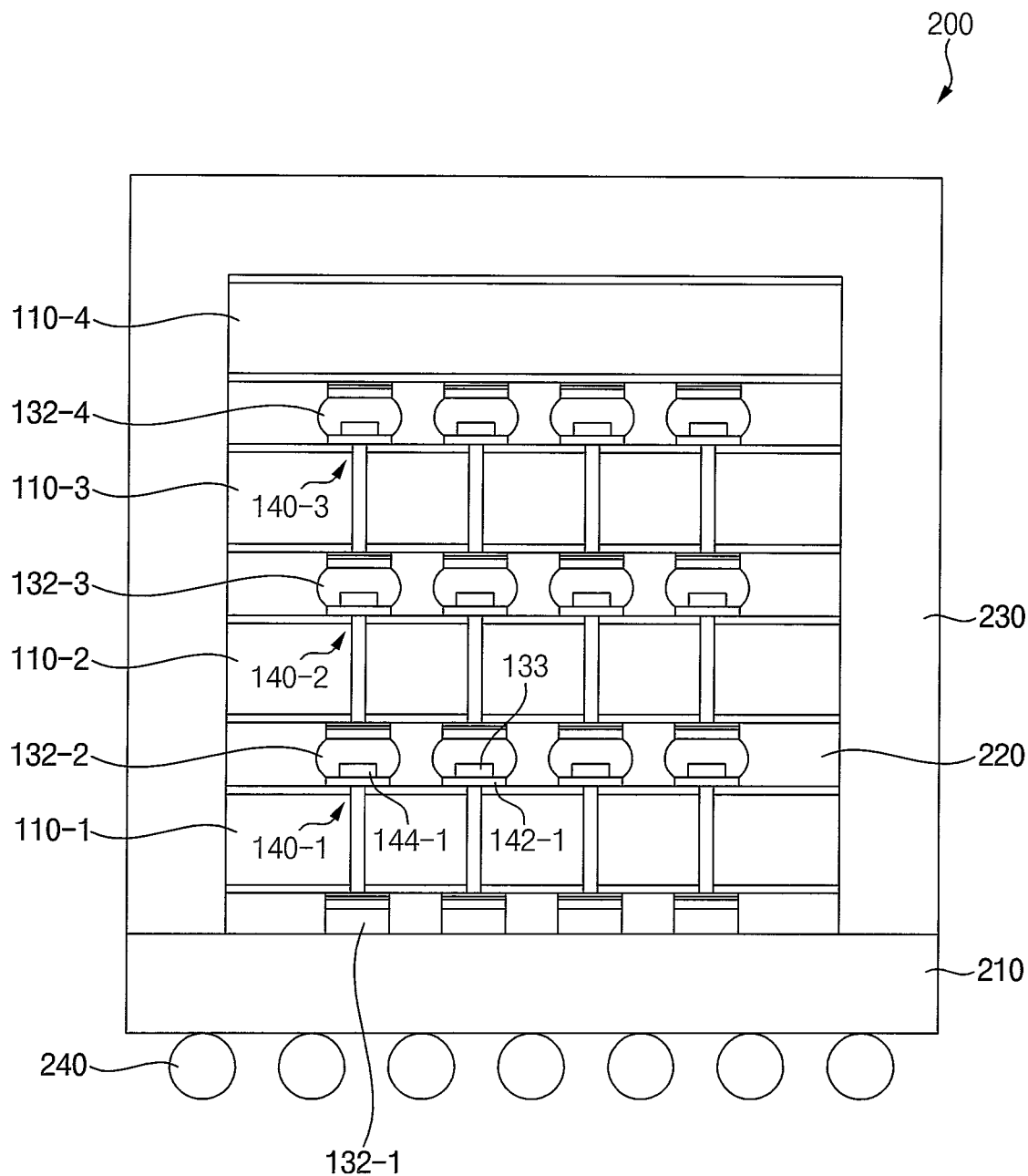

FIG. 17 is a cross-sectional view illustrating a semiconductor package including the interconnection structure in FIG. 1.

Referring to FIG. 17, a semiconductor package 200 of this example embodiment may include a package substrate 210, a plurality of semiconductor chips, an insulation film 220, a molding member 230, and external terminals 240.

The semiconductor chips may be stacked on an upper surface of the package substrate 210. In example embodiments, the semiconductor chips may include first to fourth semiconductor chips 110-1, 110-2, 110-3, and 110-4. However, stacked numbers of the semiconductor chips may not be restricted within a specific number. For example, the stacked numbers of the semiconductor chips may be eight, twelve, etc.

Each of the first to fourth semiconductor chips 110-1, 110-2, 110-3, and 110-4 may include the interconnection structure 100 in FIG. 1. Thus, when the first to fourth semiconductor chips 110-1, 110-2, 110-3, and 110-4 are sequentially stacked on the upper surface of the package substrate 210, a first conductive bump 132-1 of the first semiconductor chip 110-1 may be oriented toward the package substrate 210. The first conductive bump 132-1 may be electrically connected with the package substrate 210. For example, the first conductive bump 132-1 may contact the package substrate 210. A second conductive bump 132-2 of the second semiconductor chip 110-2 may be oriented toward a first upper pad 140-1 of the first semiconductor chip 110-1. A third conductive bump 132-3 of the third semiconductor chip 110-3 may be oriented toward a second upper pad 140-2 of the second semiconductor chip 110-2. A fourth conductive bump 132-4 of the fourth semiconductor chip 110-4 may be oriented toward a third upper pad 140-3 of the third semiconductor chip 110-3.

The insulation film 220 may be interposed between the first to fourth semiconductor chips 110-1, 110-2, 110-3, and 110-4. Particularly, the insulation film 220 may be interposed between the first semiconductor chip 110-1 and the second semiconductor chip 110-2, between the second semiconductor chip 110-2 and the third semiconductor chip 110-3, and between the third semiconductor chip 110-3 and the fourth semiconductor chip 110-4. For example, the insulation film 220 may be attached to a lower surface of each of the first to fourth semiconductor chips 110-1, 110-2, 110-3, and 110-4. Particularly, the insulation film 220 may include a lower surface positioned on a plane lower than an upper surface of the conductive bump 132 of any one of the first to fourth semiconductor chips 110-1, 110-2, 110-3, and 110-4. Thus, the insulation film 220 may be configured to cover the conductive bump 132. The insulation film 220 may include a non-conductive film (NCF).

The first to fourth semiconductor chips 110-1, 110-2, 110-3, and 110-4 may be bonded to each other by a thermal compression process. For example, the second semiconductor chip 110-2 may be downwardly pressed to thermally compress the second semiconductor chip 110-2 to the first semiconductor chip 110-1. A first interconnection pad 144-1 of the first semiconductor chip 110-1 may penetrate the insulation film 220 to make contact with the second conductive bump 132-2 of the second semiconductor chip 110-2. As mentioned above, because the first interconnection pad 144-1 having the width narrower than a width of a first body pad 142-1 may be protruded from the first body pad 142-1, the first interconnection pad 144-1 may easily penetrate the insulation film 220 to accurately make contact with the second conductive bump 132-2 of the second semiconductor chip 110-2.

Particularly, the first interconnection pad 144-1 may be inserted into a central portion of a lower surface of the second conductive bump 132-2 to form a receiving groove 133 configured to receive the first interconnection pad 144-1. Therefore, an edge portion of the second conductive bump 132-2 around the receiving groove 133 may make contact with an upper surface of the first body pad 142-1.

The molding member 230 may be formed on the upper surface of the package substrate 210 to cover the first to fourth semiconductor chips 110-1, 110-2, 110-3, and 110-4. The molding member 230 may include an epoxy molding compound (EMC).

The external terminals 240 may be mounted on a lower surface of the package substrate 210. The external terminals 240 may include solder balls.

FIGS. 18 to 21 are cross-sectional views illustrating a method of manufacturing the semiconductor package in FIG. 17.

Figure 18:
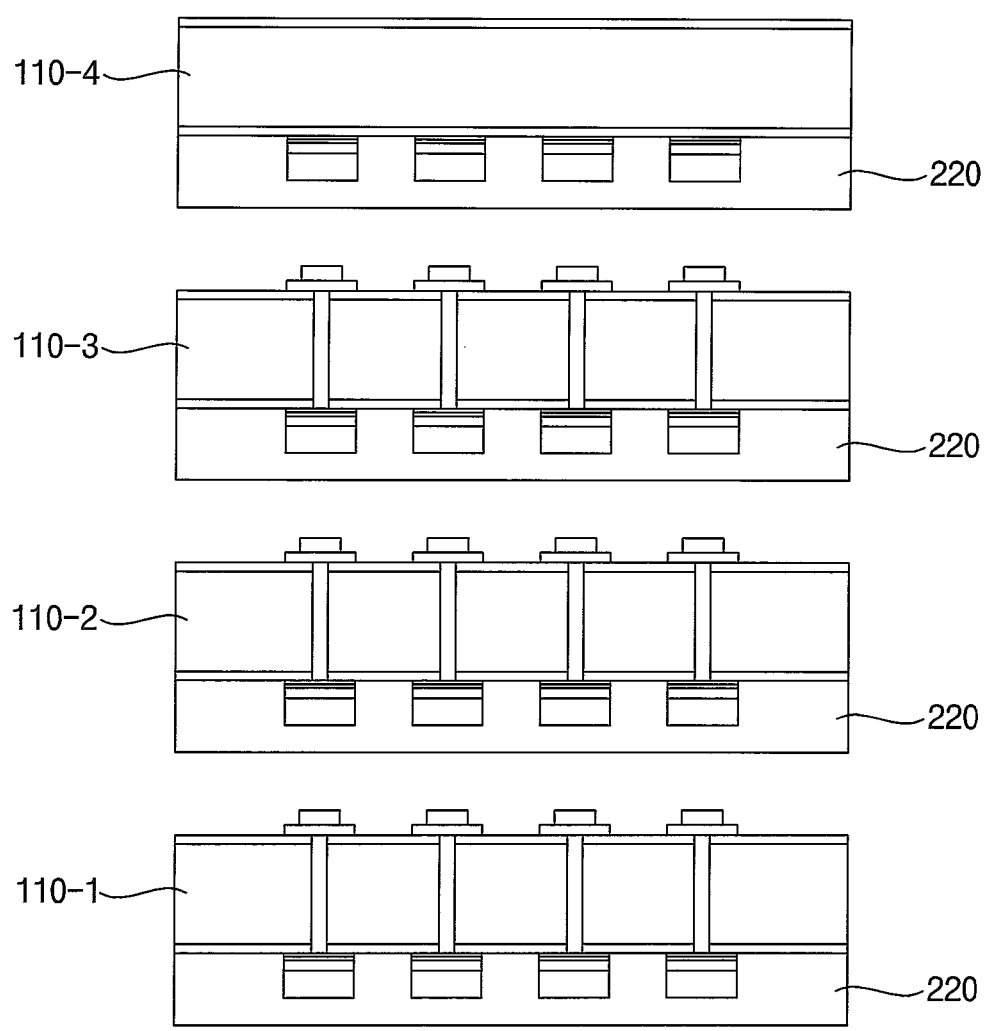

Referring to FIG. 18, the insulation film 220 may be attached to the lower surface of each of the first to fourth semiconductor chip 110-1, 110-2, 110-3, and 110-4. The first to fourth semiconductor chips 110-1, 110-2, 110-3, and 110-4 with the insulation film 220 may be sequentially arranged.

Figure 19:
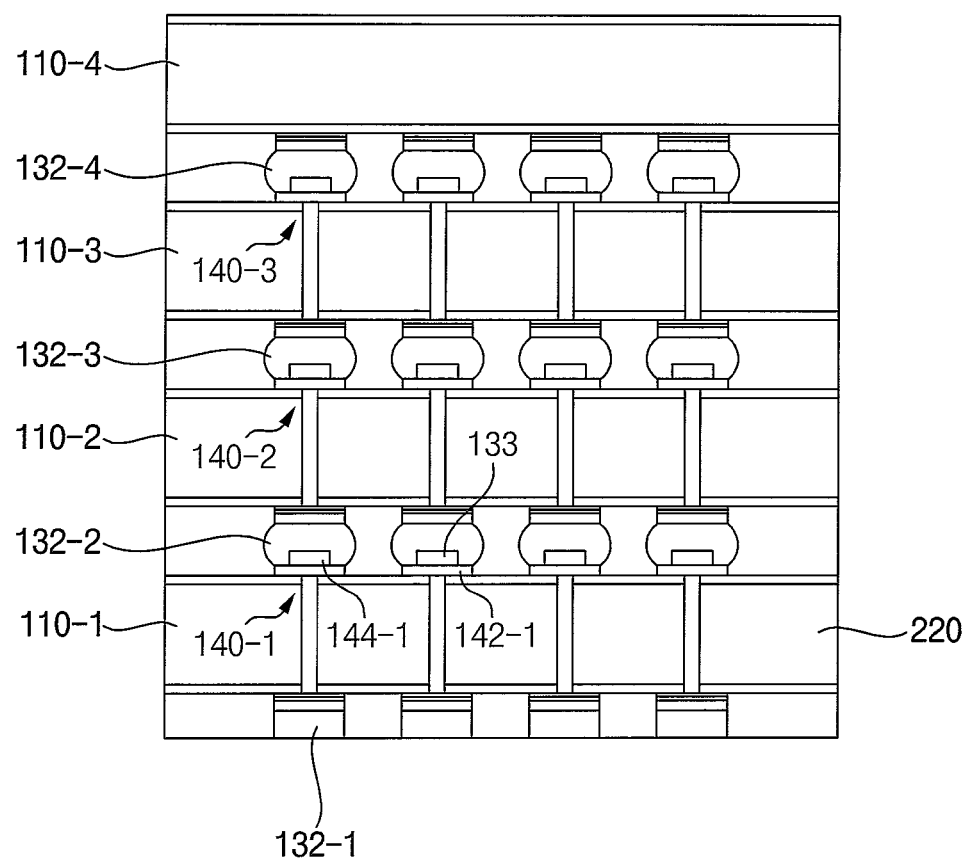

Referring to FIG. 19, the second semiconductor chip 110-2 may be bonded to the first semiconductor chip 110-1 by the thermal compression process. The third semiconductor chip 110-3 may be bonded to the second semiconductor chip 110-2 by the thermal compression process. The fourth semiconductor chip 110-4 may be bonded to the third semiconductor chip 110-3 by the thermal compression process. For example, when the second semiconductor chip 110-2 may be downwardly compressed to the first semiconductor chip 110-1, the first interconnection pad 144-1 of the first semiconductor chip 110-1 may penetrate the insulation film 220 to make contact with the second conductive bump 132-2 of the second semiconductor chip 110-2. Particularly, the first interconnection pad 144-1 may be inserted into the central portion of the lower surface of the second conductive bump 132-2 to form the receiving groove 133 configured to receive the first interconnection pad 144-1. Therefore, the edge portion of the second conductive bump 132-2 around the receiving groove 133 may make contact with the upper surface of the first body pad 142-1.

Figure 20:
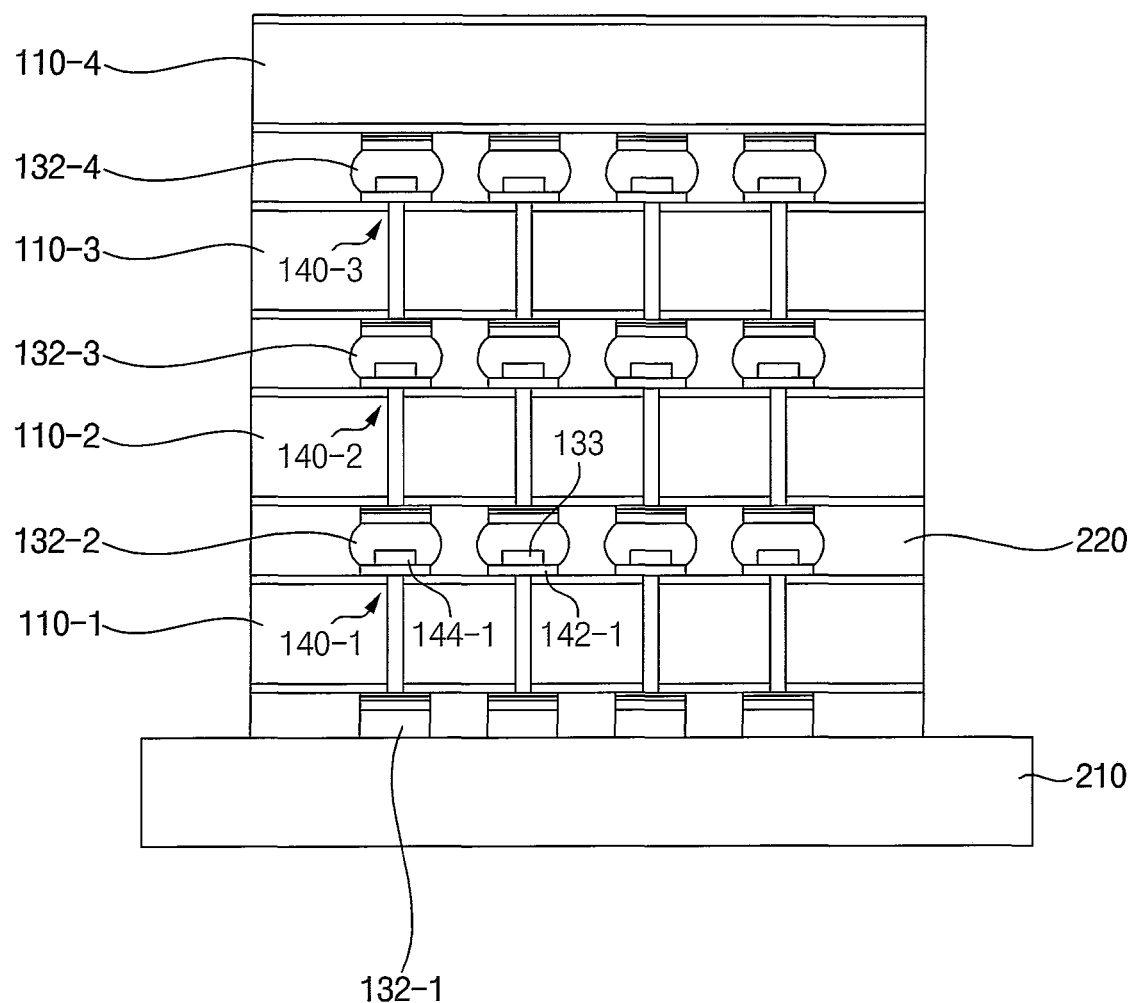

Referring to FIG. 20, the stacked first to fourth semiconductor chip 110-1, 110-2, 110-3, and 110-4 may be arranged on the upper surface of the package substrate 210. The first conductive bump 132-1 of the first semiconductor chip 110-1 may be electrically connected with the package substrate 210.

Figure 21:
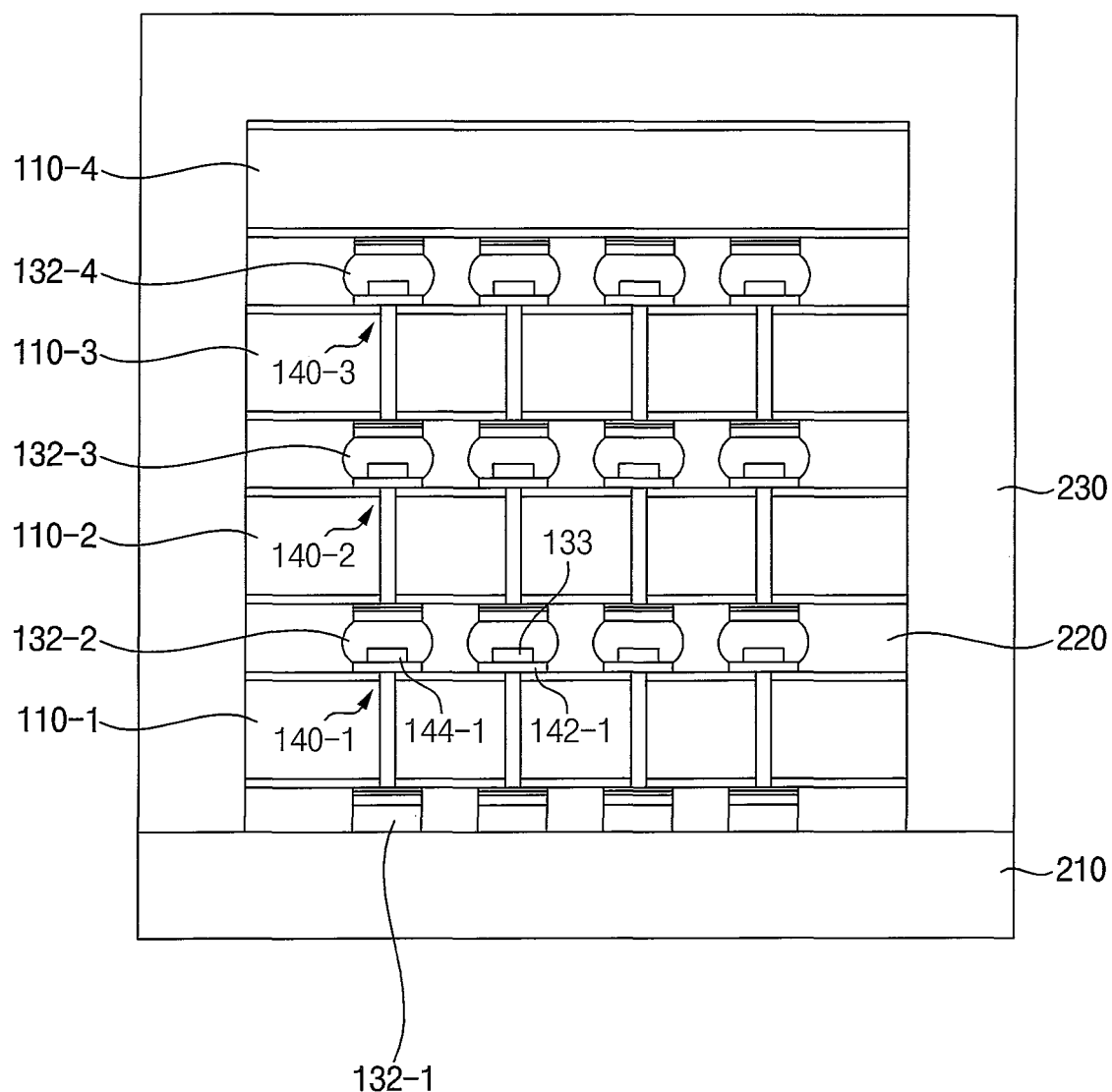

Referring to FIG. 21, the molding member 230 may be formed on the upper surface of the package substrate 210 to cover the first to fourth semiconductor chip 110-1, 110-2, 110-3, and 110-4.

The external terminals 240 may be mounted on the lower surface of the package substrate 210 to complete the semiconductor package 200.

Figure 22:
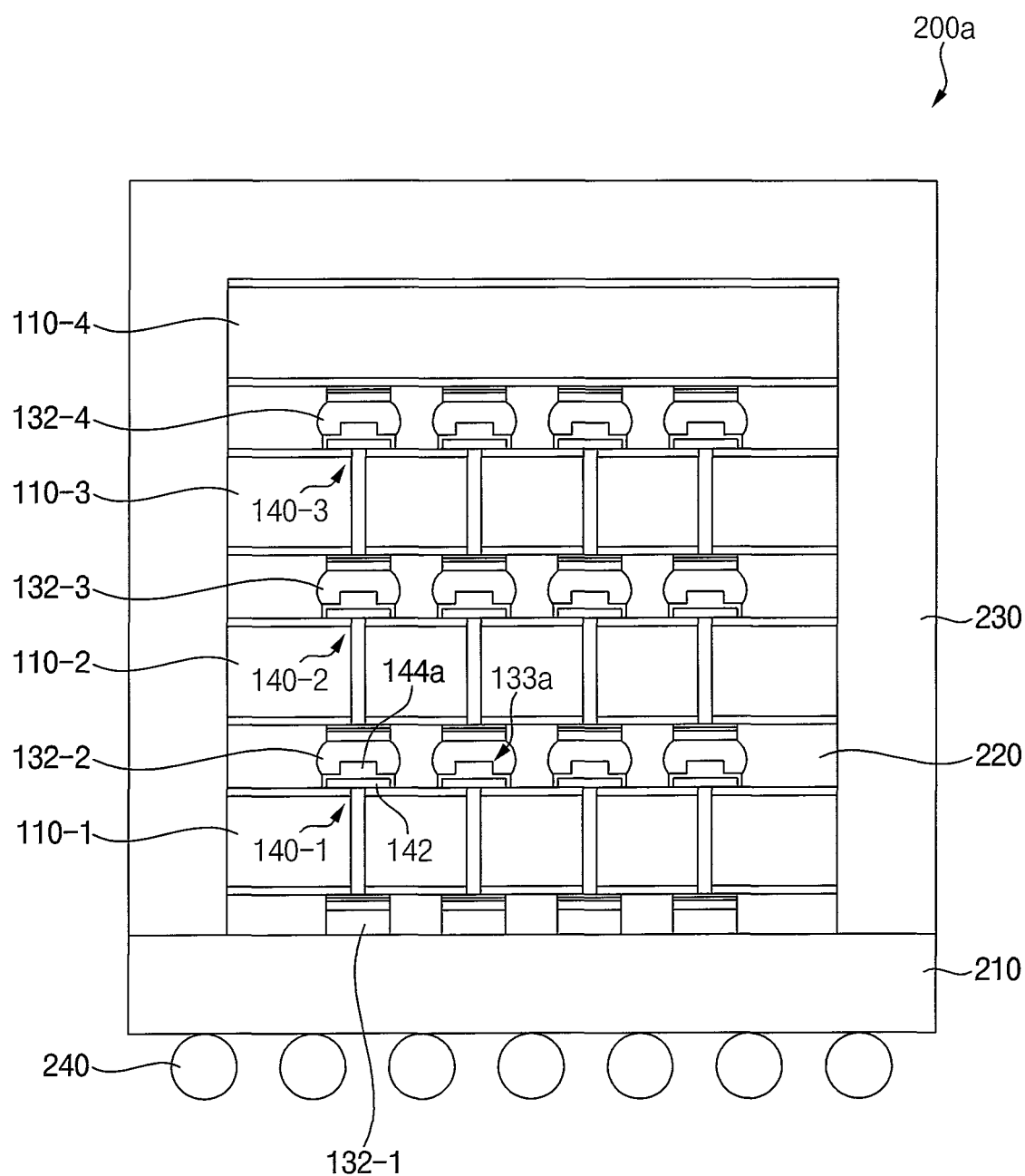

FIG. 22 is a cross-sectional view illustrating a semiconductor package including the interconnection structure in FIG. 12.

A semiconductor package 200a of this example embodiment may include elements substantially the same as those of the semiconductor package 200 in FIG. 17 except for an interconnection structure. Thus, the same reference numerals may refer to the same elements and any further illustrations with respect to the same elements may be omitted herein for brevity.

Referring to FIG. 22, the semiconductor package 200a may include the interconnection structure 100a in FIG. 12. For example, the interconnection pad 144 of each of the first to fourth semiconductor chips 110-1, 110-2, 110-3, and 110-4 may be configured to surround the upper surface and the side surfaces of the body pad 142.

Therefore, the first interconnection pad 144-1 may be inserted into the central portion of the lower surface of the second conductive bump 132-2 to form a receiving groove 133a configured to receive the first interconnection pad 144-1. Therefore, an edge portion of the second conductive bump 132-2 around the receiving groove 133a may make contact with the upper surface of the first body pad 142-1.

Figure 23:
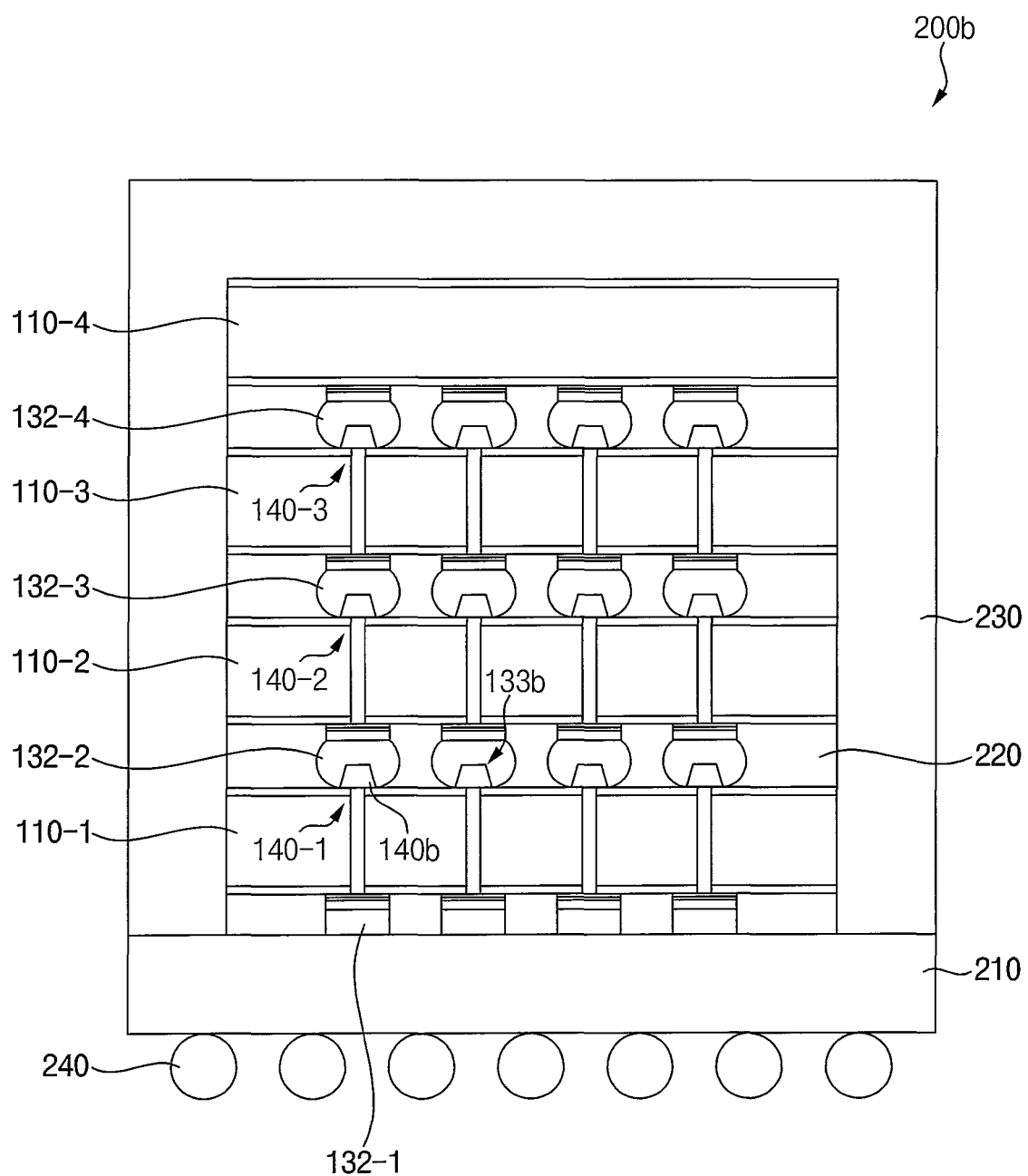

FIG. 23 is a cross-sectional view illustrating a semiconductor package including the interconnection structure in FIG. 15.

A semiconductor package 200b of this example embodiment may include elements substantially the same as those of the semiconductor package 200 in FIG. 17 except for an interconnection structure. Thus, the same reference numerals may refer to the same elements and any further illustrations with respect to the same elements may be omitted herein for brevity.

Referring to FIG. 23, the semiconductor package 200b may include the interconnection structure 100 in FIG. 15. For example, the upper pad 140b of each of the first to fourth semiconductor chips 110-1, 110-2, 110-3, and 110-4 may have the slant side surfaces.

Therefore, the slant upper pad 140b may be inserted into the central portion of the lower surface of the second conductive bump 132-2 to form a receiving groove 133b configured to receive the first upper pad 140-1.

Figure 24:
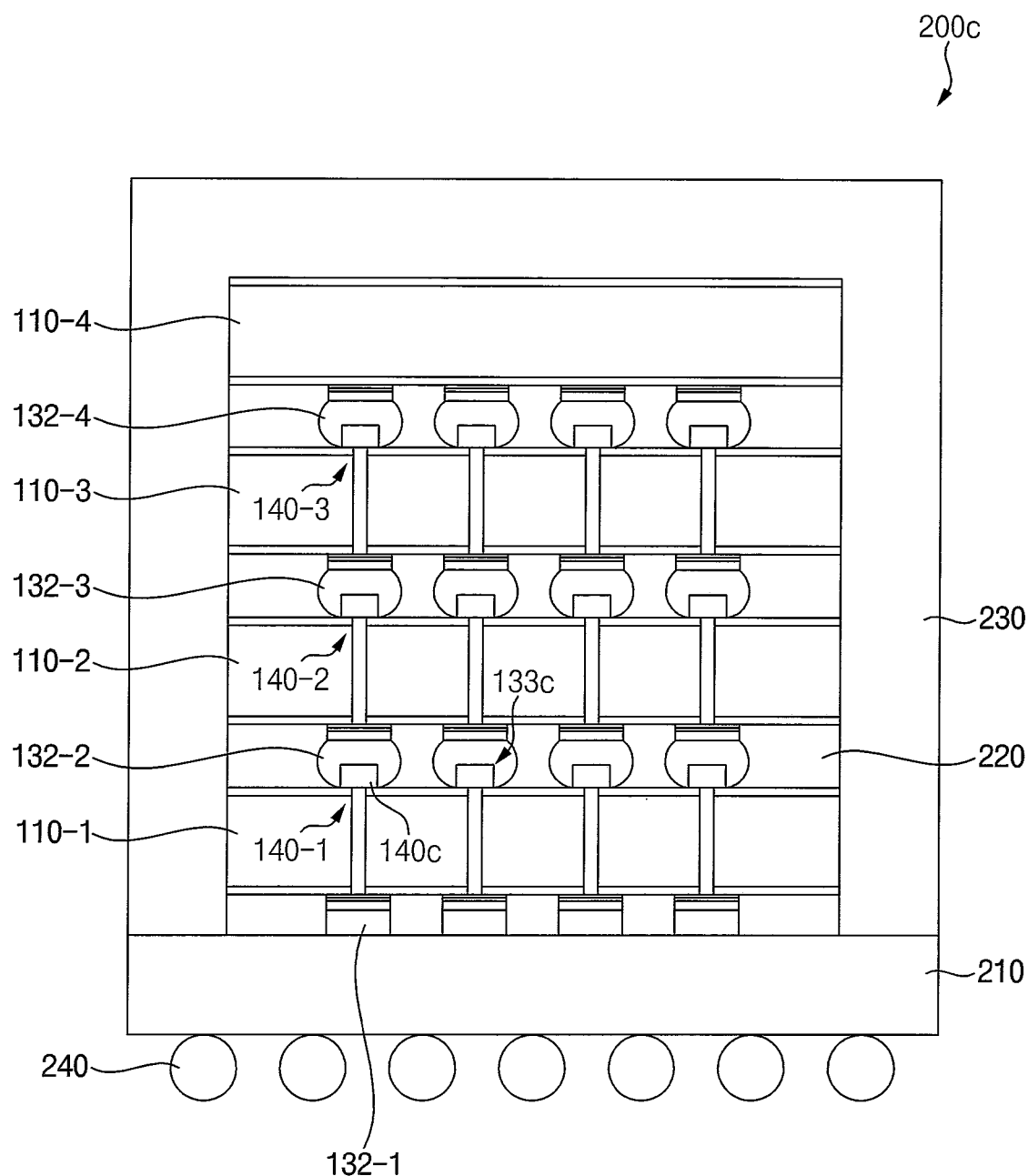

FIG. 24 is a cross-sectional view illustrating a semiconductor package including the interconnection structure in FIG. 16.

A semiconductor package 200c of this example embodiment may include elements substantially the same as those of the semiconductor package 200 in FIG. 17 except for an interconnection structure. Thus, the same reference numerals may refer to the same elements and any further illustrations with respect to the same elements may be omitted herein for brevity.

Referring to FIG. 24, the semiconductor package 200c may include the interconnection structure 100 in FIG. 16. For example, the upper pad 140 of each of the first to fourth semiconductor chips 110-1, 110-2, 110-3, and 110-4 may have the uniform width.

The uniform width of the first upper pad 140-1 may be narrower than the width of the second conductive bump 132-2 so that the first upper pad 140-1 may be inserted into the central portion of the lower surface of the second conductive bump 132-2 to form a receiving groove 133c configured to receive the first upper pad 140-1.

Figure 25:
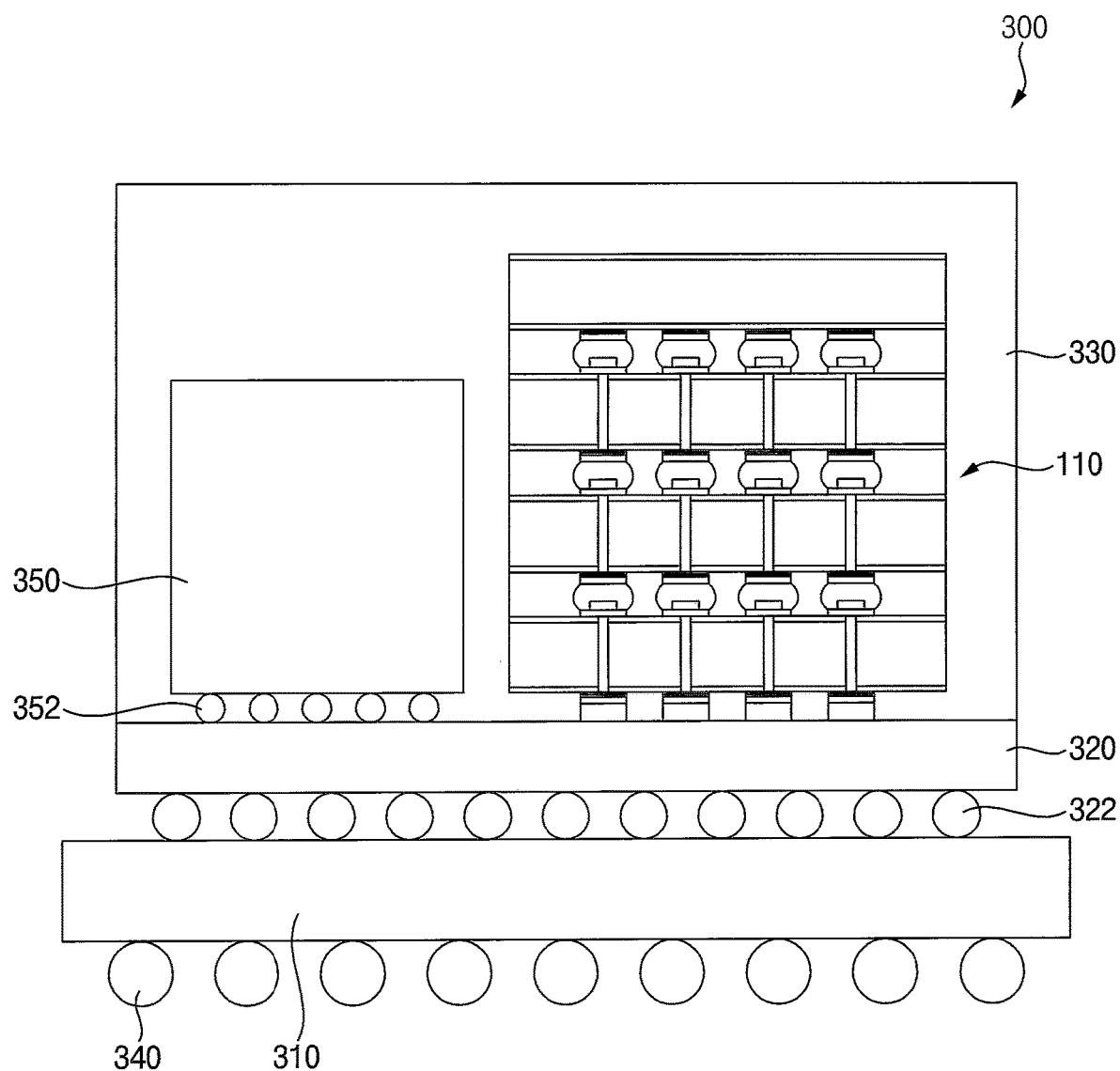

FIG. 25 is a cross-sectional view illustrating a semiconductor package including the interconnection structure in FIG. 1.

Referring to FIG. 25, a semiconductor package 300 of this example embodiment may include a 2.5D stack type semiconductor package. Thus, the semiconductor package 300 may include a package substrate 310, an interposer 320, at least one first semiconductor chip 350, a plurality of second semiconductor chips 110, a molding member 330, and external terminals 340.

The interposer 320 may be arranged on an upper surface of the package substrate 310. The interposer 320 may be electrically connected with the package substrate 310 via a plurality of conductive bumps 322.

The first semiconductor chip 350 may be arranged on an upper surface of the interposer 320. The first semiconductor chip 350 may be electrically connected with the interposer 320 via conductive bumps 352. The first semiconductor chip 350 may include a central processing unit (CPU), a graphic processing unit (GPU), etc.

The second semiconductor chips 110 may be arranged on the upper surface of the interposer 320. The second semiconductor chips 110 may correspond to the semiconductor chips 110 in FIG. 17. For example, the second semiconductor chips 110 may be electrically connected with each other via the interconnection structure 100 in FIG. 1. Alternatively, the semiconductor package 300 may include the interconnection structure 100a in FIG. 12, the interconnection structure 100b in FIG. 15, or the interconnection structure 100c in FIG. 16. The second semiconductor chips 110 may include a high bandwidth memory (HBM) chip.

The molding member 330 may be formed on the upper surface of the package substrate 310 to cover the first semiconductor chip 350 and the second semiconductor chips 110. The molding member 330 may include an epoxy molding compound (EMC).

The external terminals 340 may be mounted on a lower surface of the package substrate 310. The external terminals 340 may include solder balls.

Figure 26:
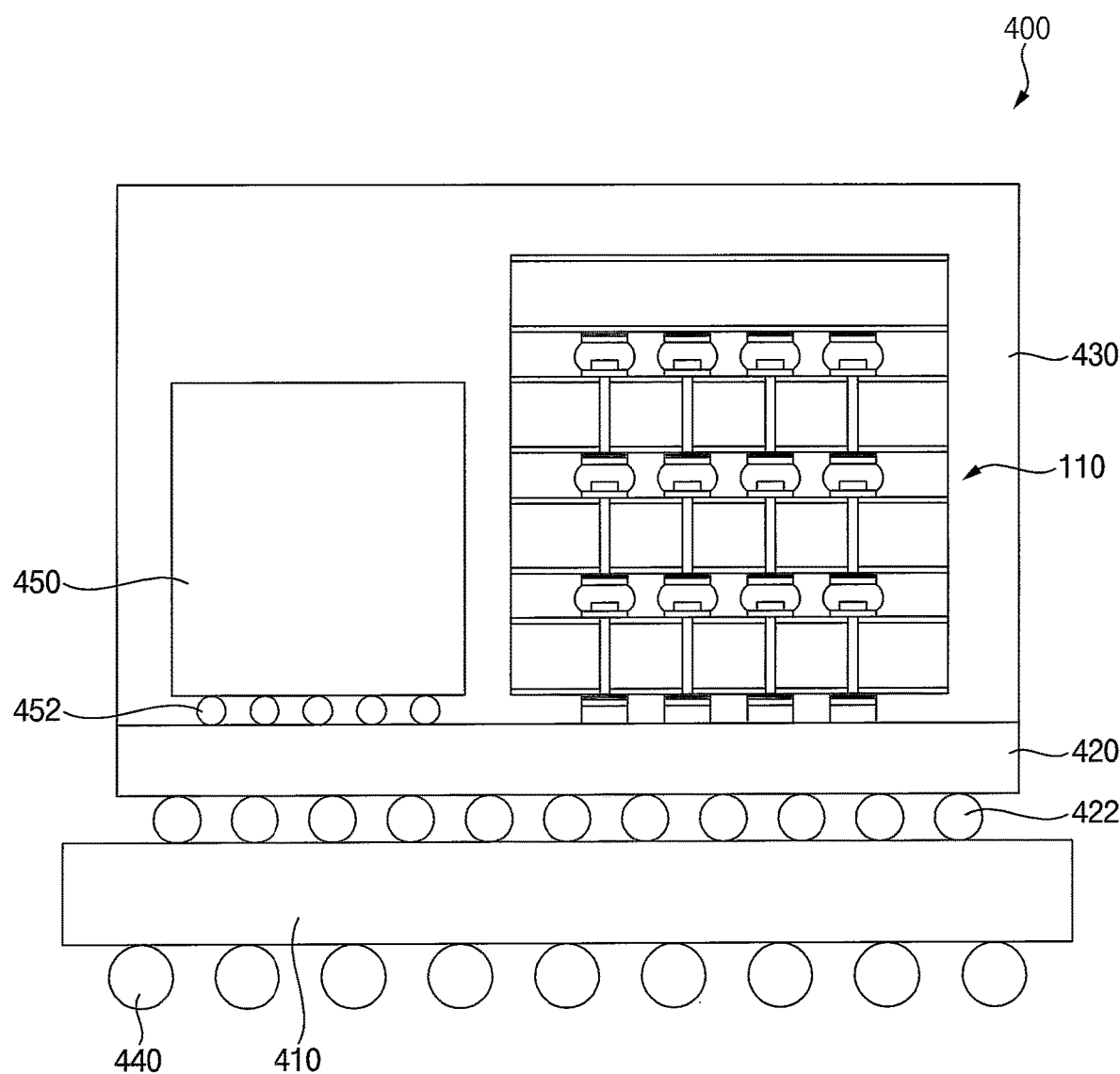

FIG. 26 is a cross-sectional view illustrating a semiconductor package including the interconnection structure in FIG. 1.

Referring to FIG. 26, a semiconductor package 400 of this example embodiment may include a 3.0D stack type semiconductor package. Thus, the semiconductor package 400 may include a package substrate 410, a logic chip 420, at least one first semiconductor chip 450, a plurality of second semiconductor chips 110, a molding member 430, and external terminals 440.

The logic chip 420 may be arranged on an upper surface of the package substrate 410. The logic chip 420 may be electrically connected with the package substrate 410 via a plurality of conductive bumps 422.

The first semiconductor chip 450 may be arranged on an upper surface of the logic chip 420. The first semiconductor chip 450 may be electrically connected with the logic chip 420 via conductive bumps 452. The first semiconductor chip 450 may include an SRAM chip.

The second semiconductor chips 110 may be arranged on the upper surface of the logic chip 420. The second semiconductor chips 110 may correspond to the semiconductor chips 110 in FIG. 17. For example, the second semiconductor chips 110 may be electrically connected with each other via the interconnection structure 100 in FIG. 1. Alternatively, the semiconductor package 300 may include the interconnection structure 100a in FIG. 12, the interconnection structure 100b in FIG. 15, or the interconnection structure 100c in FIG. 16. The second semiconductor chips 110 may include a high bandwidth memory (HBM) chip.

The molding member 430 may be formed on the upper surface of the package substrate 410 to cover the first semiconductor chip 450 and the second semiconductor chips 110. The molding member 430 may include an epoxy molding compound (EMC).

The external terminals 440 may be mounted on a lower surface of the package substrate 410. The external terminals 440 may include solder balls.

According to example embodiments, the width of the upper pad may be wider than the width of the interconnection via and narrower than the width of the lower pad to improve electrical connection reliability between the upper pad and the conductive bump. Thus, an electrical short between the conductive bumps may not be generated in the interconnection structure having a thin thickness.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An interconnection structure of a semiconductor chip, the interconnection structure comprising:
   an interconnection via arranged in the semiconductor chip;
   a lower pad arranged on a lower end of the interconnection via exposed through a lower surface of the semiconductor chip;
   a conductive bump arranged on the lower pad; and
   an upper pad including a body pad arranged on an upper end of the interconnection via exposed through an upper surface of the semiconductor chip, and an interconnection pad arranged on an upper surface of the body pad,
   wherein the body pad has a width substantially the same as a width of the lower pad, and the interconnection pad has a width wider than a width of the interconnection via and narrower than the width of the lower pad.

2. The interconnection structure of claim 1, wherein the interconnection pad is positioned on a central portion of the upper surface of the body pad.

3. The interconnection structure of claim 1, wherein the interconnection pad is arranged on an upper surface and a side surface of the body pad.

4. The interconnection structure of claim 1, wherein the width of the lower pad is about 15 μm to about 20 μm, the width of the interconnection via is about 4 μm to about 5 μm, and the width of the interconnection pad is about 5 μm to about 8 μm.

5. The interconnection structure of claim 1, wherein the upper pad has a thickness thinner than a thickness of the lower pad.

6. The interconnection structure of claim 1, wherein the interconnection pad has a thickness thicker than a thickness of the body pad.

7. The interconnection structure of claim 6, wherein the thickness of the body pad is about 2 μm to about 3 μm, and the thickness of the interconnection pad is about 4 μm to about 5 μm.

8. The interconnection structure of claim 1,
   wherein the body pad comprises nickel, and
   wherein the interconnection pad comprises gold.

9. A semiconductor package comprising:
   a package substrate;
   a first semiconductor chip arranged on an upper surface of the package substrate;
   a first interconnection via arranged in the first semiconductor chip;
   a first lower pad arranged on a lower end of the first interconnection via exposed through a lower surface of the first semiconductor chip;
   a first conductive bump arranged on the first lower pad and electrically connected with the package substrate;
   a first upper pad including a first body pad arranged on an upper end of the first interconnection via exposed through an upper surface of the first semiconductor chip, and a first interconnection pad arranged on an upper surface of the first body pad;
   a second semiconductor chip arranged over the first semiconductor chip;
   an insulation film interposed between the first semiconductor chip and the second semiconductor chip;
   a second interconnection via arranged in the second semiconductor chip;
   a second lower pad arranged on a lower end of the second interconnection via exposed through a lower surface of the second semiconductor chip;
   a second conductive bump arranged on the second lower pad and electrically connected with the first upper pad; and
   a second upper pad including a second body pad arranged on an upper end of the second interconnection via exposed through an upper surface of the second semiconductor chip, and a second interconnection pad arranged on an upper surface of the second body pad,
   wherein the first body pad has a width substantially the same as a width of the first lower pad, and the first interconnection pad has a width wider than a width of the first interconnection via and narrower than the width of the first lower pad, and wherein the second body pad has a width substantially the same as a width of the second lower pad, and the second interconnection pad has a width wider than a width of the second interconnection via and narrower than the width of the second lower pad.

10. The semiconductor package of claim 9, wherein the second conductive bump comprises a receiving groove configured to receive the first interconnection pad.

11. The semiconductor package of claim 9,
wherein the first interconnection pad is positioned on a central portion of the upper surface of the first body pad, and
wherein the second interconnection pad is positioned on a central portion of the upper surface of the second body pad.

12. The semiconductor package of claim 9,
wherein the first interconnection pad is arranged on an upper surface and a side surface of the first body pad, and
wherein the second interconnection pad is arranged on an upper surface and a side surface of the second body pad.

13. The semiconductor package of claim 9,
wherein the first interconnection pad has a thickness thicker than a thickness of the first body pad, and
wherein the second interconnection pad has a thickness thicker than a thickness of the second body pad.

14. A semiconductor package comprising:
a package substrate;
a first semiconductor chip arranged on an upper surface of the package substrate;
a first interconnection via arranged in the first semiconductor chip;
a first lower pad arranged on a lower end of the first interconnection via exposed through a lower surface of the first semiconductor chip;
a first conductive bump arranged on the first lower pad and electrically connected with the package substrate;
a first upper pad arranged on an upper end of the first interconnection via exposed through an upper surface of the first semiconductor chip, the first upper pad having a width wider than a width of the first interconnection via and narrower than a width of the first lower pad;
a second semiconductor chip arranged over the first semiconductor chip;
an insulation film interposed between the first semiconductor chip and the second semiconductor chip;
a second interconnection via arranged in the second semiconductor chip;
a second lower pad arranged on a lower end of the second interconnection via exposed through a lower surface of the second semiconductor chip;
a second conductive bump arranged on the second lower pad and electrically connected with the first upper pad; and
a second upper pad arranged on an upper end of the second interconnection via exposed through an upper surface of the second semiconductor chip, the second upper pad having a width wider than a width of the second interconnection via and narrower than a width of the second lower pad.

15. The semiconductor package of claim 14, wherein the second conductive bump comprises a receiving groove configured to receive the first interconnection pad.

16. The semiconductor package of claim 14,
wherein the first upper pad comprises:
a first body pad arranged on the upper end of the first interconnection via; and
a first interconnection pad arranged on the first body pad to electrically make contact with the second conductive bump, the first interconnection pad having a width wider than the width of the first interconnection via and narrower than a width of the first body pad, and
wherein the second upper pad comprises:
a second body pad arranged on the upper end of the second interconnection via; and
a second interconnection pad arranged on the second body pad, the second interconnection pad having a width wider than the width of the second interconnection via and narrower than a width of the second body pad.

17. The semiconductor package of claim 16,
wherein the first interconnection pad is positioned on a central portion of the upper surface of the first body pad, and
wherein the second interconnection pad is positioned on a central portion of the upper surface of the second body pad.

18. The semiconductor package of claim 16,
wherein the first interconnection pad is arranged on an upper surface and a side surface of the first body pad, and
wherein the second interconnection pad is arranged on an upper surface and a side surface of the second body pad.

19. The semiconductor package of claim 16,
wherein the first interconnection pad has a thickness thicker than a thickness of the first body pad, and
wherein the second interconnection pad has a thickness thicker than a thickness of the second body pad.

20. The semiconductor package of claim 14,
wherein the first upper pad comprises:
a first lower surface having a lower width; and
a first upper surface having an upper width gradually decreased from the lower width; and
wherein the second upper pad comprises:
a second lower surface having a lower width; and
a second upper surface having an upper width gradually decreased from the lower width.

* * * * *